US012289922B2

(12) United States Patent
Iga

(10) Patent No.: US 12,289,922 B2
(45) Date of Patent: Apr. 29, 2025

(54) PROCESSING METHOD

(71) Applicant: DISCO CORPORATION, Tokyo (JP)

(72) Inventor: Hayato Iga, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 404 days.

(21) Appl. No.: 18/052,316

(22) Filed: Nov. 3, 2022

(65) Prior Publication Data

US 2023/0142363 A1 May 11, 2023

(30) Foreign Application Priority Data

Nov. 11, 2021 (JP) ................. 2021-183906

(51) Int. Cl.
H10D 89/00 (2025.01)
H01L 21/304 (2006.01)

(52) U.S. Cl.
CPC ......... H10D 89/011 (2025.01); H01L 21/304 (2013.01)

(58) Field of Classification Search
None
See application file for complete search history.

(56) References Cited

U.S. PATENT DOCUMENTS

| | | | |
|---|---|---|---|
| 2005/0282359 A1* | 12/2005 | Nagai | B23K 26/53 438/464 |
| 2016/0288251 A1* | 10/2016 | Hirata | B23K 26/0853 |
| 2017/0053829 A1* | 2/2017 | Hirata | H10D 62/8325 |
| 2021/0245304 A1* | 8/2021 | Kanezaki | B23K 26/0006 |

FOREIGN PATENT DOCUMENTS

| | | |
|---|---|---|
| JP | 11040520 A | 2/1999 |
| JP | 2006012902 A | 1/2006 |

OTHER PUBLICATIONS

Office Action issued by the US Patent and Trademark Office for U.S. Appl. No. 18/153,402, dated Nov. 20, 2024.

* cited by examiner

Primary Examiner — Shaun M Campbell
Assistant Examiner — Carnell Hunter, III
(74) Attorney, Agent, or Firm — GREER BURNS & CRAIN, LTD.

(57) ABSTRACT

A processing method for processing a single-crystal silicon wafer that has a first surface and a second surface formed in such a manner that a specific crystal plane included in a crystal plane {100} is exposed in each of the first and second surfaces and has devices formed in the respective regions marked out by planned dividing lines in the first surface. The method includes forming dividing origins along each planned dividing line, forming a separation layer along the crystal plane of the second surface through relatively moving a focal point and the wafer along a first direction that is parallel to the crystal plane of the second surface and in which an acute angle formed between the first direction and the crystal orientation <100> is equal to or smaller than 5°, and separating the wafer into a first-surface-side wafer including devices and a second-surface-side wafer including no devices.

2 Claims, 21 Drawing Sheets

PROCESSING METHOD

BACKGROUND OF THE INVENTION

Field of the Invention

The present invention relates to a processing method for processing a single-crystal silicon wafer that has a first surface and a second surface located on the opposite side to the first surface that are formed in such a manner that a specific crystal plane included in the crystal plane {100} is exposed in each of the first surface and the second surface and has devices each formed in corresponding one of multiple regions marked out by multiple planned dividing lines set in a lattice manner in the first surface.

Description of the Related Art

To manufacture semiconductor device chips, for example, a wafer formed of single-crystal silicon is used. Specifically, first, multiple planned dividing lines are set in a lattice manner in the front surface of the wafer and devices such as an integrated circuit (IC) are formed in the respective regions that are marked out by the multiple planned dividing lines and have a rectangular shape. Subsequently, a dividing origin when the wafer is divided is formed along each planned dividing line by executing cutting processing or laser processing along each planned dividing line. Thereafter, the wafer is divided into multiple device chips by grinding the back surface side of the wafer (for example, refer to Japanese Patent Laid-open No. Hei 11-40520 and Japanese Patent Laid-open No. 2006-12902).

SUMMARY OF THE INVENTION

However, when the back surface side is ground, for example, a part with a thickness equal to or larger than half the thickness of the wafer before the grinding is removed, and therefore the amount of wear of grinding abrasive stones is comparatively large, which is uneconomic. In addition, a grinding apparatus is contaminated due to a lot of grinding dust generated in the grinding, and therefore a need to frequently clean the grinding apparatus arises. There is also a problem that the frequent cleaning is troublesome for the worker. The present invention is made in view of such a problem and intends to reduce the amount of grinding of a wafer after formation of a dividing origin when the wafer is divided into multiple device chips.

In accordance with an aspect of the present invention, there is provided a processing method for processing a single-crystal silicon wafer that has a first surface and a second surface located on the opposite side to the first surface that are formed in such a manner that a specific crystal plane included in a crystal plane {100} is exposed in each of the first surface and the second surface and has devices each formed in corresponding one of multiple regions marked out by multiple planned dividing lines set in a lattice manner in the first surface. The processing method includes a dividing origin forming step of forming dividing origins for dividing the single-crystal silicon wafer along each planned dividing line at least at a depth corresponding to a finished thickness of device chips, a separation layer forming step of forming a separation layer along the crystal plane of the second surface at a depth corresponding to a position on the side of the second surface relative to the dividing origins through positioning a focal point of a pulsed laser beam having such a wavelength as to be transmitted through the single-crystal silicon wafer to the inside of the single-crystal silicon wafer and relatively moving the focal point and the single-crystal silicon wafer along a first direction that is parallel to the crystal plane of the second surface and in which an acute angle formed between the first direction and a crystal orientation <100> is equal to or smaller than 5°, and a separation step of separating the single-crystal silicon wafer into a first-surface-side wafer including multiple devices formed on the side of the first surface and a second-surface-side wafer that is located on the side of the second surface and does not include the devices by using the separation layer as an origin after the dividing origin forming step and the separation layer forming step. The separation layer forming step has a modified region forming step of forming modified regions by relatively moving the focal point of the laser beam and the single-crystal silicon wafer along the first direction and an indexing feed step of executing indexing feed of the focal point and the single-crystal silicon wafer relatively in a second direction that is parallel to the crystal plane of the second surface and is orthogonal to the first direction. The separation layer includes the modified regions and cracks that extend with the modified regions being origins.

Preferably, the processing method further includes a grinding step of grinding the side of a third surface located on the opposite side to the first surface in the first-surface-side wafer and dividing the first-surface-side wafer into multiple device chips after the separation step.

In the processing method according to the aspect of the present invention, the dividing origins are formed at the depth corresponding to the finished thickness of the device chips in the dividing origin forming step. In addition, the separation layer is formed at the depth corresponding to a position on the second surface side relative to the dividing origins in the separation layer forming step. Moreover, in the separation step, the single-crystal silicon wafer is separated into the first-surface-side wafer including the multiple devices formed on the first surface side and the second-surface-side wafer that is located on the second surface side and does not include the devices by using the separation layer as the origin. Grinding the separation layer side of the first-surface-side wafer can divide the first-surface-side wafer into the multiple device chips. Therefore, the amount of grinding of the single-crystal silicon wafer can be reduced compared with the case of grinding the single-crystal silicon wafer from the second surface of the single-crystal silicon wafer and dividing the single-crystal silicon wafer into the multiple device chips.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
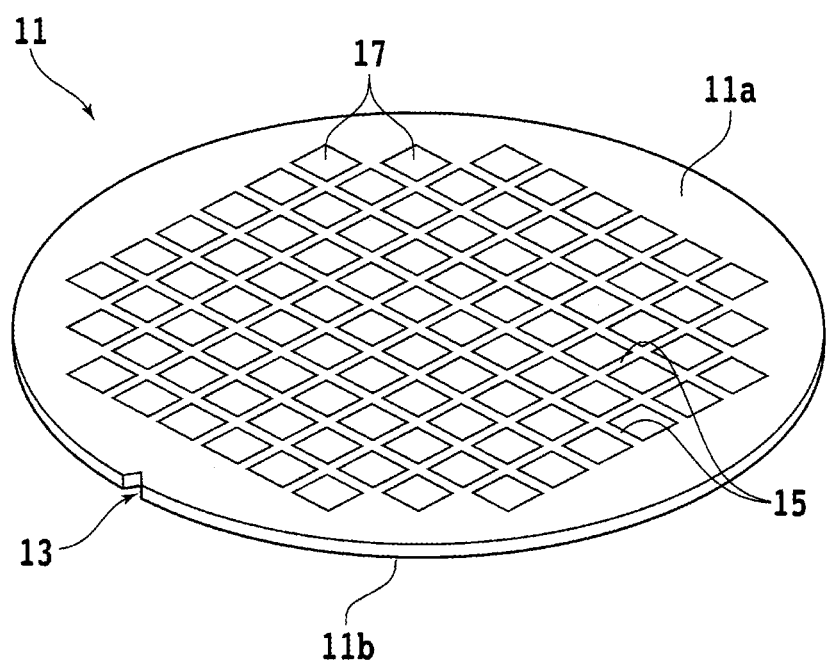
FIG. 1 is a perspective view of a wafer.
Figure 2:
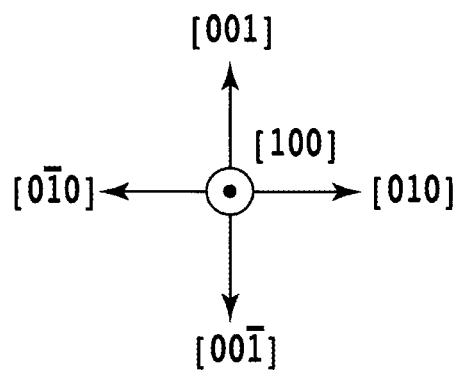
FIG. 2 is a plan view of the wafer.
Figure 2:
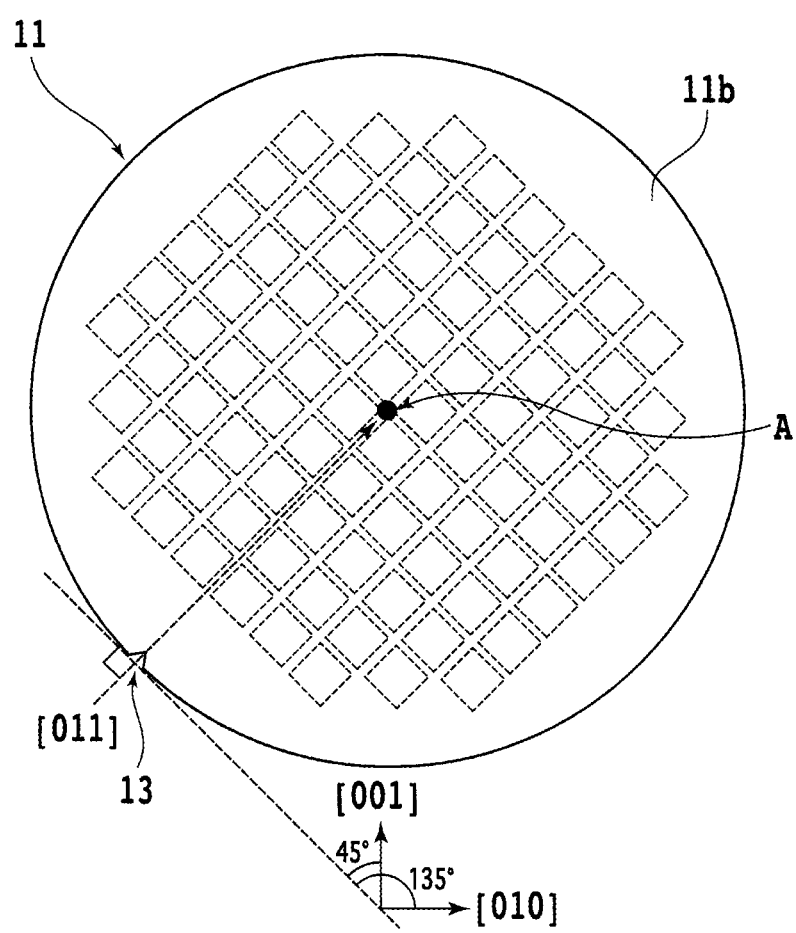

Embodiments of the present invention will be described with reference to the accompanying drawings. FIG. 1 is a perspective view illustrating a wafer 11. FIG. 2 is a plan view illustrating the wafer 11. The wafer 11 of the present specification means a single-crystal silicon wafer. In FIG. 2, crystal orientations of the wafer 11 are also illustrated. The wafer 11 has a circular plate shape and has a front surface (first surface) 11a and a back surface (second surface) 11b that have a substantially circular shape. The back surface 11b is located on the opposite side to the front surface 11a in the thickness direction of the wafer 11.

The diameter of the wafer 11 is approximately 300 mm (12 inches), for example, and the thickness from the front surface 11a to the back surface 11b is approximately 775 µm. However, the diameter and the thickness of the wafer 11 are not limited to this example. The wafer 11 is formed in such a manner that a specific crystal plane included in the crystal plane {100} is exposed in each of the front surface 11a and the back surface 11b. For example, as illustrated in FIG. 2, the crystal plane (100) is exposed in the back surface 11b, and the crystal plane (100) is exposed also in the front surface 11a. That is, each perpendicular line to the back surface 11b and the front surface 11a (crystal axis orthogonal to each surface) is along the crystal orientation [100].

Each of the back surface 11b and the front surface 11a may be a surface slightly inclined from the specific crystal plane included in the crystal plane {100} due to a processing error in the manufacturing of the wafer 11, or the like. Specifically, each of the back surface 11b and the front surface 11a may be a surface in which the acute angle formed between the surface and the crystal plane (100) is equal to or smaller than 1°. That is, the crystal axis orthogonal to the back surface 11b and the front surface 11a may be along a direction in which the acute angle formed between the direction and the crystal orientation [100] is equal to or smaller than 1°.

In the present specification, a state that the front surface 11a and the back surface 11b are formed in such a manner that a specific crystal plane included in the crystal plane {100} is exposed in each of the front surface 11a and the back surface 11b includes a case in which the front surface 11a and the back surface 11b are surfaces slightly inclined from the specific crystal plane in addition to a case in which the front surface 11a and the back surface 11b are the specific crystal plane included in the crystal plane {100}. A state of being slightly inclined from the specific crystal plane means that the acute angle formed between the front surface 11a (the back surface 11b) and the crystal plane (100) is equal to or smaller than 1°, for example.

Incidentally, a notch 13 indicating the crystal orientation of the wafer 11 is formed at the outer circumferential part of the wafer 11. The direction that goes from the notch 13 to a center A of the back surface 11b (or the center of the front surface 11a) is a specific crystal orientation included in the crystal orientation <110>. In the present embodiment, as illustrated in FIG. 2, the direction that goes from the notch 13 to the center A is the crystal orientation [011]. As illustrated in FIG. 1, multiple planned dividing lines (streets) 15 are set in a lattice manner in the front surface 11a.

A device 17 such as an IC is formed in each of multiple regions marked out by the multiple planned dividing lines 15. Next, description will be made about a processing method of the wafer 11 in which the wafer 11 is divided into multiple device chips 35 by processing the wafer 11 along each planned dividing line 15 (that is, a manufacturing method of the device chips 35).

Figure 3:
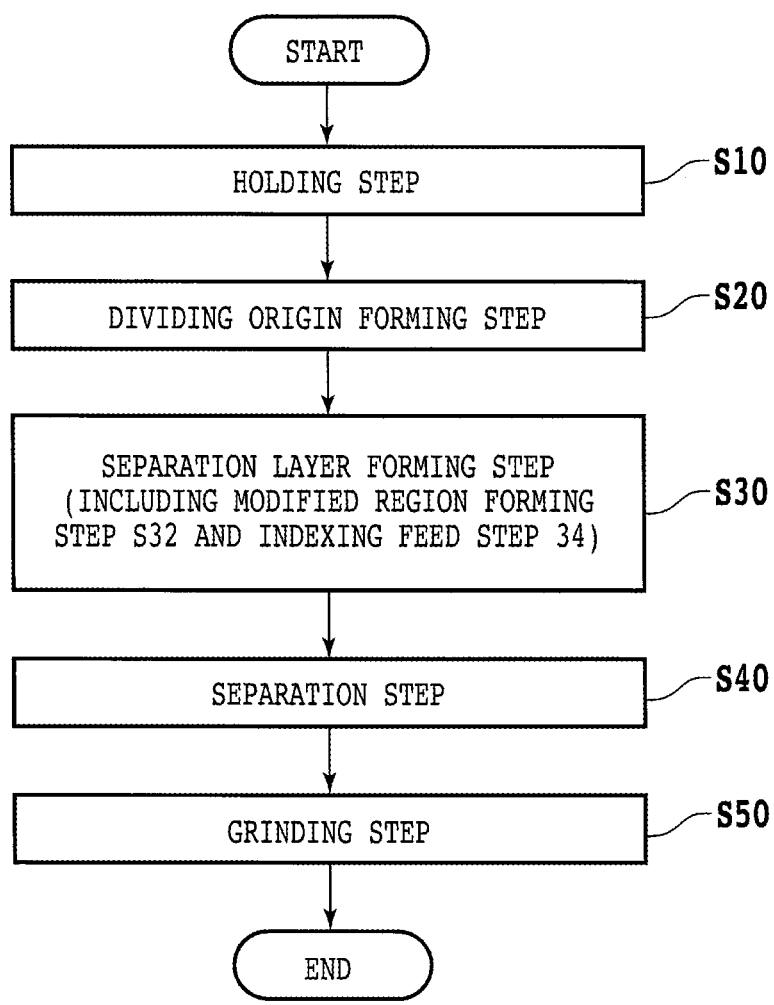
FIG. 3 is a flowchart of a processing method.

FIG. 3 is a flowchart of a processing method according to a first embodiment. The outline of the processing method is as follows. First, the wafer 11 is held by a chuck table 26 (see FIG. 4) to be described later (holding step S10). Thereafter, dividing origins 23 (see FIG. 7) are formed on the side of the front surface 11a of the wafer 11 by using a laser processing apparatus 2 (see FIG. 4) (dividing origin forming step S20). Subsequently, a separation layer 25 (see FIG. 9 to FIG. 12) is formed inside the wafer 11 by using the laser processing apparatus 2 (separation layer forming step S30).

Thereafter, the wafer 11 is separated into a front-surface-side wafer (first-surface-side wafer) 31 having the devices 17 and a back-surface-side wafer (second-surface-side wafer) 33 that does not have the devices 17 by using the separation layer 25 as the origin (see FIG. 14A and FIG. 14B) (separation step S40). Subsequently, the side of a separation surface (third surface) 31a located on the opposite side to the front surface 11a in the front-surface-side wafer (first-surface-side wafer) 31 having the devices 17 is ground (see FIG. 15), and thus the front-surface-side wafer 31 is divided into the multiple device chips 35 (grinding step S50) (see FIG. 16).

Figure 4:
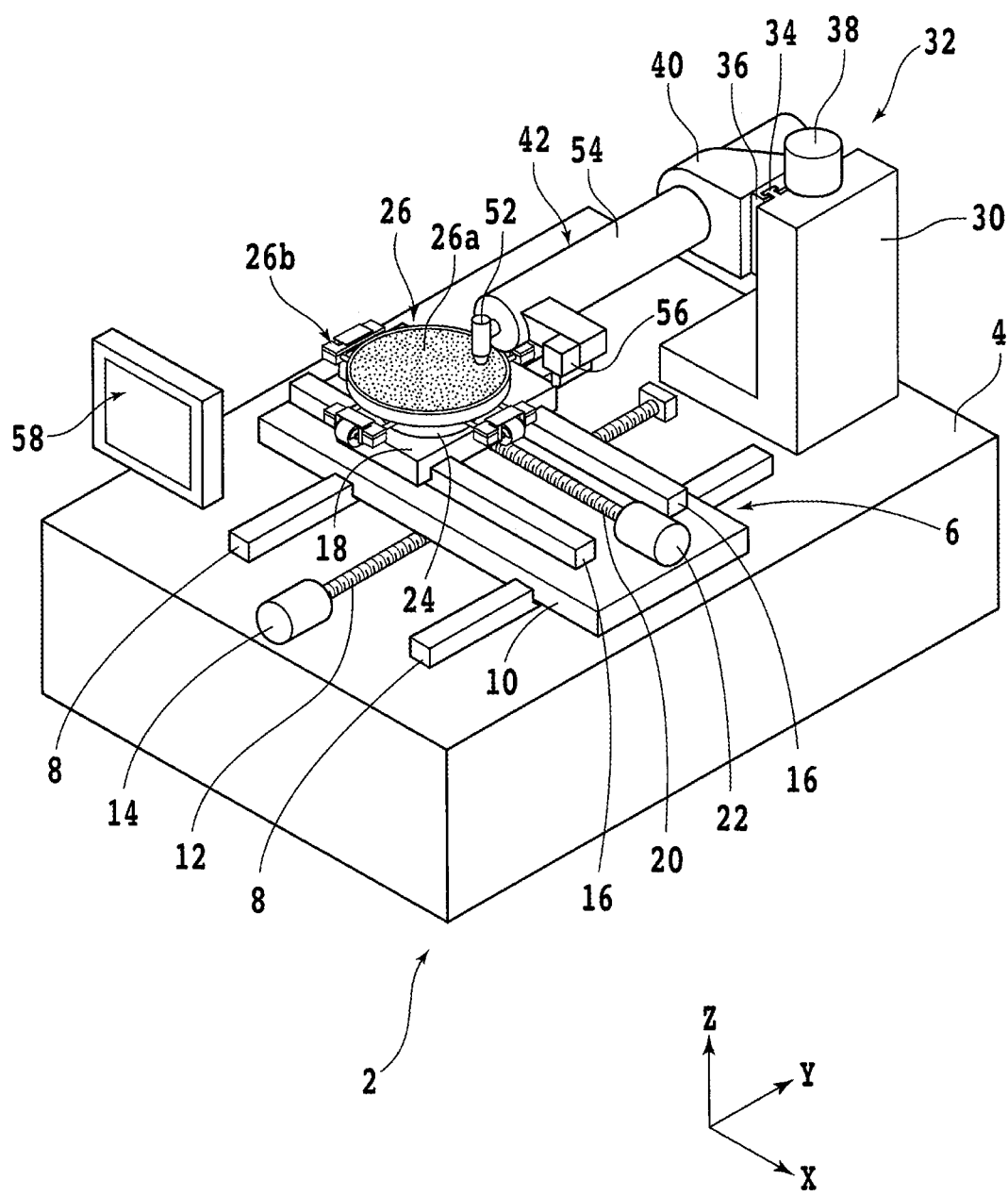
FIG. 4 is a perspective view of a laser processing apparatus.

FIG. 4 is a perspective view of the laser processing apparatus 2. An X-axis direction (left-right direction), a Y-axis direction (front-rear direction), and a Z-axis direction (upward-downward direction, vertical direction) each illustrated in FIG. 4 are orthogonal to each other. The laser processing apparatus 2 has a base 4 that supports the respective constituent elements. An X-axis Y-axis movement mechanism 6 is disposed on the upper surface of the base 4. The X-axis Y-axis movement mechanism 6 has a pair of Y-axis guide rails 8 that are fixed to the upper surface of the base 4 and are disposed along the Y-axis direction.

A Y-axis moving plate 10 is attached to the upper surface side of the pair of Y-axis guide rails 8 slidably along the pair of Y-axis guide rails 8. A ball screw is disposed on the lower surface side of the Y-axis moving plate 10. The ball screw has a nut part (not illustrated) fixed to the lower surface of the Y-axis moving plate 10. A screw shaft 12 is coupled to the nut part in such a manner as to be capable of rotating by using balls (not illustrated). The screw shaft 12 is disposed between the pair of Y-axis guide rails 8 along the Y-axis direction. A motor 14 for rotating the screw shaft 12 is coupled to one end part of the screw shaft 12. When the motor 14 is operated, the Y-axis moving plate 10 moves along the Y-axis direction. The pair of Y-axis guide rails 8, the Y-axis moving plate 10, the screw shaft 12, the nut part, the motor 14, and so forth configure a Y-axis movement mechanism.

A pair of X-axis guide rails 16 are fixed to the upper surface of the Y-axis moving plate 10. The pair of X-axis guide rails 16 are disposed along the X-axis direction. An X-axis moving plate 18 is attached to the upper surface side of the pair of X-axis guide rails 16 slidably along the pair of X-axis guide rails 16. A ball screw is disposed on the lower surface side of the X-axis moving plate 18. The ball screw has a nut part (not illustrated) fixed to the lower surface of the X-axis moving plate 18. A screw shaft 20 is coupled to the nut part in such a manner as to be capable of rotating by using balls (not illustrated). The screw shaft 20 is disposed between the pair of X-axis guide rails 16 along the X-axis direction. A motor 22 for rotating the screw shaft 20 is coupled to one end part of the screw shaft 20. When the motor 22 is operated, the X-axis moving plate 18 moves along the X-axis direction. The pair of X-axis guide rails 16, the X-axis moving plate 18, the screw shaft 20, the nut part, the motor 22, and so forth configure an X-axis movement mechanism.

A table base 24 with a circular column shape is disposed on the upper surface side of the X-axis moving plate 18. The table base 24 has a rotational drive source (not illustrated) such as a motor. The chuck table 26 with a circular plate shape is disposed on the top part of the table base 24. The rotational drive source can rotate the chuck table 26 in a predetermined angle range with a straight line that passes through the center of a holding surface 26a of the chuck table 26 and is parallel to the Z-axis direction being the rotation axis. The chuck table 26 has a circular plate-shaped frame body formed of a non-porous metal. A recessed part (not illustrated) with a circular plate shape is formed at a central part of the frame body. A circular plate-shaped porous plate formed of a ceramic is fixed to this recessed part. A predetermined flow path (not illustrated) is formed in the frame body. A negative pressure is transmitted from a suction source (not illustrated) such as an ejector to the upper surface of the porous plate through the predetermined flow path.

The annular upper surface of the frame body and the circular upper surface of the porous plate are substantially flush with each other and function as the substantially flat holding surface 26a for sucking and holding the wafer 11. The wafer 11 can move along both the X-axis and Y-axis directions by the X-axis Y-axis movement mechanism 6 in the state of being sucked and held by the holding surface 26a. At the outer circumferential part of the chuck table 26, multiple (in the present embodiment, four) clamp units 26b are disposed at substantially equal intervals along the circumferential direction of the chuck table 26. Each clamp unit 26b clamps a frame 19b (see FIG. 16) of a wafer unit 21 to be described later.

A support structure 30 is disposed on a predetermined region in the base 4 located on the rear side of the X-axis Y-axis movement mechanism 6. A Z-axis movement mechanism 32 is disposed on one side surface along the Y-Z plane in the support structure 30. The Z-axis movement mechanism 32 has a pair of Z-axis guide rails 34. The pair of Z-axis guide rails 34 are fixed to the one side surface of the support structure 30 and are disposed along the Z-axis direction. A Z-axis moving plate 36 is attached to the pair of Z-axis guide rails 34 slidably along the pair of Z-axis guide rails 34. A ball screw (not illustrated) is disposed on the back surface side of the Z-axis moving plate 36. The ball screw has a nut part (not illustrated) fixed to the back surface of the Z-axis moving plate 36.

A screw shaft (not illustrated) is coupled to the nut part in such a manner as to be capable of rotating by using balls. The screw shaft is disposed between the pair of Z-axis guide rails 34 along the Z-axis direction. A motor 38 for rotating the screw shaft is coupled to an upper end part of the screw shaft. When the motor 38 is operated, the Z-axis moving plate 36 moves along the Z-axis direction. A support implement 40 is fixed to the front surface side of the Z-axis moving plate 36. The support implement 40 supports part of a laser beam irradiation unit 42.

Figure 5:
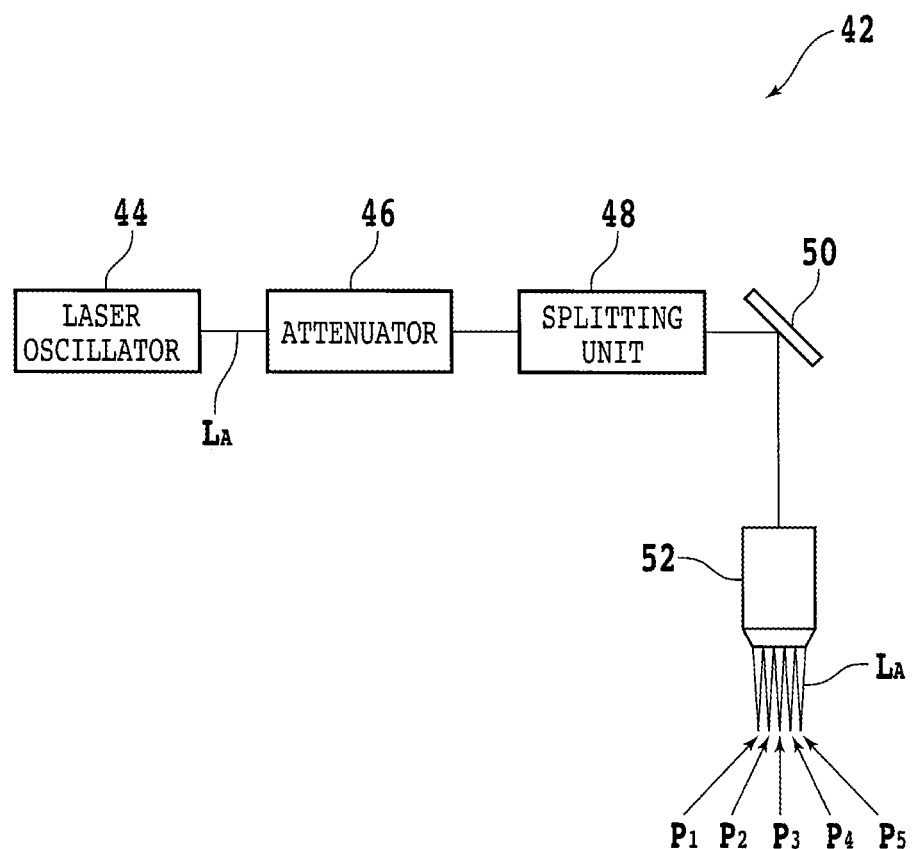
FIG. 5 is a schematic diagram of a laser beam irradiation unit.

FIG. 5 is a schematic diagram of the laser beam irradiation unit 42. In FIG. 5, part of constituent elements of the laser beam irradiation unit 42 is illustrated by functional blocks. The laser beam irradiation unit 42 has a laser oscillator 44 fixed to the base 4. For example, the laser oscillator 44 has Nd:YVO$_4$ or the like as a laser medium and emits a pulsed laser beam $L_A$ having such a wavelength (for example, 1342 nm) as to be transmitted through the wafer 11 (that is, a single-crystal silicon). The laser beam $L_A$ travels to a splitting unit 48 after its output power is adjusted by an attenuator 46. The splitting unit 48 of the present embodiment has a liquid crystal on silicon-spatial light modulator (LCOS-SLM).

The splitting unit 48 has a function of splitting the laser beam $L_A$. For example, the splitting unit 48 splits the laser beam $L_A$ in such a manner that the laser beam $L_A$ emitted from an irradiation head 52 forms multiple focal points that line up at substantially equal intervals along the Y-axis direction. In FIG. 5, an example in which the laser beam $L_A$ is split to form five focal points $P_1$ to $P_5$ by the splitting unit 48 is illustrated. However, the laser beam $L_A$ may be split to form focal points in a predetermined number equal to or larger than two (more specifically at least two and at most 16).

The splitting unit 48 has also a function of allowing the laser beam $L_A$ to be merely transmitted through the splitting unit 48 without splitting the laser beam $L_A$. Whether or not to split the laser beam $L_A$ can be selected by controlling operation of the splitting unit 48. Incidentally, the splitting unit 48 may have a diffraction grating instead of the LCOS-SLM. The diffraction grating splits the laser beam $L_A$ to form a predetermined number of focal points. Therefore, it is sufficient that the diffraction grating is removed from the optical path of the laser beam $L_A$ in a case in which the laser beam $L_A$ is not split.

The laser beam $L_A$ that has passed through the splitting unit 48 is reflected by a mirror 50 and is guided to the irradiation head 52. A collecting lens (not illustrated) that focuses the laser beam $L_A$ and so forth are housed in the irradiation head 52. At the time of laser processing, the irradiation head 52 is disposed to face the holding surface 26a, and the laser beam $L_A$ is emitted to the holding surface 26a. The irradiation head 52 is disposed at a front end part of a circular columnar housing 54 having a longitudinal part disposed along the Y-axis direction (see FIG. 4).

Part of the housing 54 on the rear end part side thereof is fixed by the support implement 40. Moreover, an imaging unit 56 is fixed to the side surface of the housing 54 located near the irradiation head 52 in such a manner as to be capable of facing the holding surface 26a. For example, the imaging unit 56 is a visible light camera unit having an objective lens, a light source such as a light emitting diode (LED), and an imaging element such as a charge-coupled device (CCD) image sensor or a complementary metal-oxide-semiconductor (CMOS) image sensor.

In a case of the visible light camera unit, for example, a photodiode made of silicon (Si) is used as the imaging element. The imaging unit 56 may be an infrared camera unit having a light source such as an LED and an imaging element. In a case of the infrared camera unit, for example, a photodiode made of indium gallium arsenide (InGaAs) is used as the imaging element. When the infrared camera unit is used, even in a case in which the side of the front surface 11a is sucked and held by the holding surface 26a, the planned dividing line 15 in the front surface 11a can be imaged with transmission through the wafer 11 from the side of the back surface 11b.

The irradiation head 52, the housing 54, the imaging unit 56, and so forth can integrally move along the Z-axis direction by the Z-axis movement mechanism 32. A cover (not illustrated) that covers the above-described constituent elements is disposed over the base 4. A touch panel 58 is disposed on the front surface of this cover. The touch panel 58 functions as an input device such as a touch sensor of the capacitive system and a display device such as a liquid crystal display. A worker can set a processing condition for the laser processing apparatus 2 through the touch panel 58 and can also view an image of the wafer 11 obtained by the imaging unit 56.

Next, the processing method of the wafer 11 will be described along the respective steps illustrated in FIG. 3. First, prior to the holding step S10, the wafer unit 21 in which the wafer 11 is supported by the annular frame 19b through a protective tape 19a with a larger diameter than the wafer 11 is formed (see FIG. 7). More specifically, the wafer unit 21 is formed by sticking the side of the front surface 11a of the wafer 11 to a central part of the protective tape 19a and sticking one surface of the frame 19b that has an opening with a larger diameter than the wafer 11 and that is made of a metal and has an annular shape to an outer circumferential part of the protective tape 19a.

In the present embodiment, the wafer 11 is processed in the form of the wafer unit 21. However, the steps from the holding step S10 to the grinding step S50 may be executed in a state in which the protective tape 19a with substantially the same diameter as the wafer 11 is stuck to the side of the front surface 11a without using the frame 19b. In the holding step S10, the side of the front surface 11a is sucked and held by the holding surface 26a, and the frame 19b is clamped by the respective clamp units 26b. At this time, the side of the back surface 11b is exposed upward.

Subsequently, modified regions 23a that function as the dividing origins 23 are formed along each planned dividing line 15 by executing laser processing of the wafer 11 (dividing origin forming step S20). The modified region 23a is a region in which the crystallinity of the wafer 11 is disturbed due to the occurrence of multiphoton absorption, and the mechanical strength is lowered therein compared with the region that is not irradiated with the laser beam $L_A$.

At the time of the formation of the modified regions 23a, cracks 23b extending from the modified regions 23a to the side of the front surface 11a and the side of the back surface 11b are collaterally formed. However, in the present specification, the dividing origin 23 formed by using the laser beam $L_A$ refers to the modified region 23a. In the dividing origin forming step S20, first, the deviation between one planned dividing line 15 and the X-axis direction is detected by using the imaging unit 56. Thereafter, the chuck table 26 is rotated around the predetermined rotation axis to cause the one planned dividing line 15 to become substantially parallel to the X-axis direction.

Then, without splitting the laser beam $L_A$, one focal point of the laser beam $L_A$ is positioned between a depth 11d from the back surface 11b corresponding to a finished thickness 11c of the device chips 35 and the back surface 11b. For example, when the finished thickness 11c is 50 μm, the focal point is set to a position at 70 μm from the front surface 11a. Thereafter, by moving the chuck table 26 in the X-axis direction, the modified regions 23a are formed from one end to the other end of the one planned dividing line 15 at least at the depth 11d.

Figure 6:
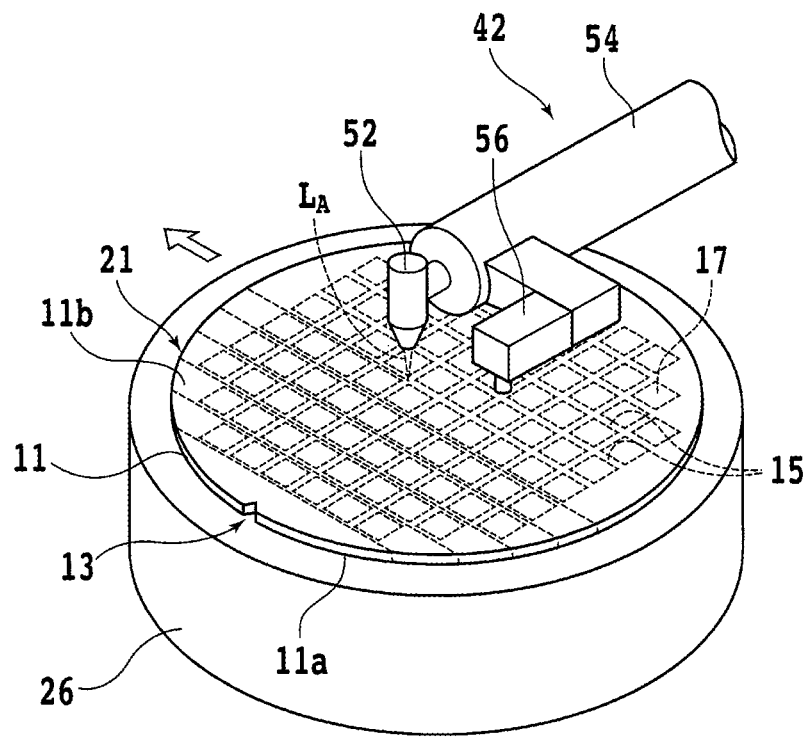
FIG. 6 is a perspective view illustrating a dividing origin forming step.
Figure 7:
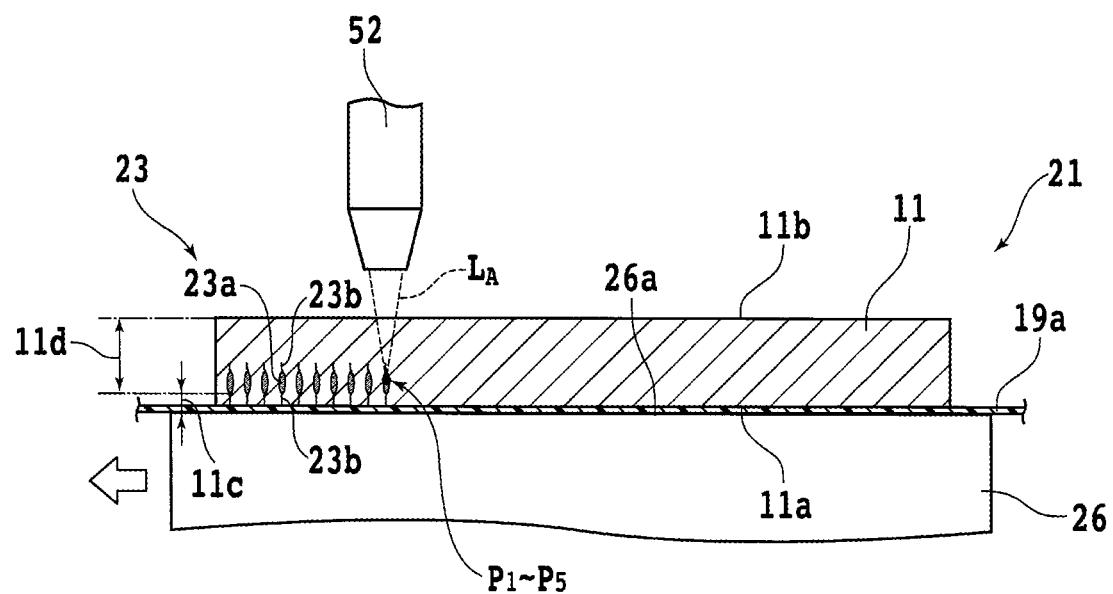
FIG. 7 is a partially sectional side view illustrating the dividing origin forming step.

FIG. 6 is a perspective view illustrating the dividing origin forming step S20. FIG. 7 is a partially sectional side view illustrating the dividing origin forming step S20. In FIG. 7, the distance between the adjacent modified regions 23a is exaggerated and is illustrated as a large distance for convenience of explanation. In FIG. 6, the protective tape 19a and the frame 19b are omitted for convenience. In FIG. 7, the frame 19b is omitted for convenience. Laser processing conditions are set as follows, for example.

Wavelength of laser beam: 1342 nm
Average output power: predetermined value of at least 0.5 W and at most 1 W
Repetition frequency of pulse: predetermined value of at least 60 kHz and at most 90 kHz
Processing feed rate: predetermined value of at least 600 mm/s and at most 800 mm/s
The number of passes: predetermined number of at least one and at most three The number of passes means the number of times of irradiation of the wafer 11 with the laser beam $L_A$ from one end to the other end of one planned dividing line 15. When the number of passes is set to two or more, the modified regions 23a are further formed at a different depth position from the depth 11d. In the dividing origin forming step S20, laser processing may be executed in a state in which the laser beam $L_A$ is split to be focused on different positions in the depth direction of the wafer 11, or laser processing may be executed in a state in which the laser beam $L_A$ is split to cause focal points to line up along the Y-axis direction.

After the irradiation with the laser beam $L_A$ is executed from one end to the other end of the one planned dividing line 15, indexing feed of the chuck table 26 is executed in the Y-axis direction by a predetermined distance (index). Thereafter, the modified regions 23a are formed from one end to the other end of another planned dividing line 15 adjacent to the already-processed planned dividing line 15 in the Y-axis direction. After the modified regions 23*a* are formed along all planned dividing lines 15 along the one direction in this manner, the chuck table 26 is rotated by 90°. Then, the modified regions 23*a* are formed along all planned dividing lines 15 along the other direction orthogonal to the one direction. In this manner, between at least the depth 11*d* and the back surface 11*b*, the dividing origins 23 (that is, the modified regions 23*a*) for dividing the wafer 11 are formed along each planned dividing line 15.

Figure 8:
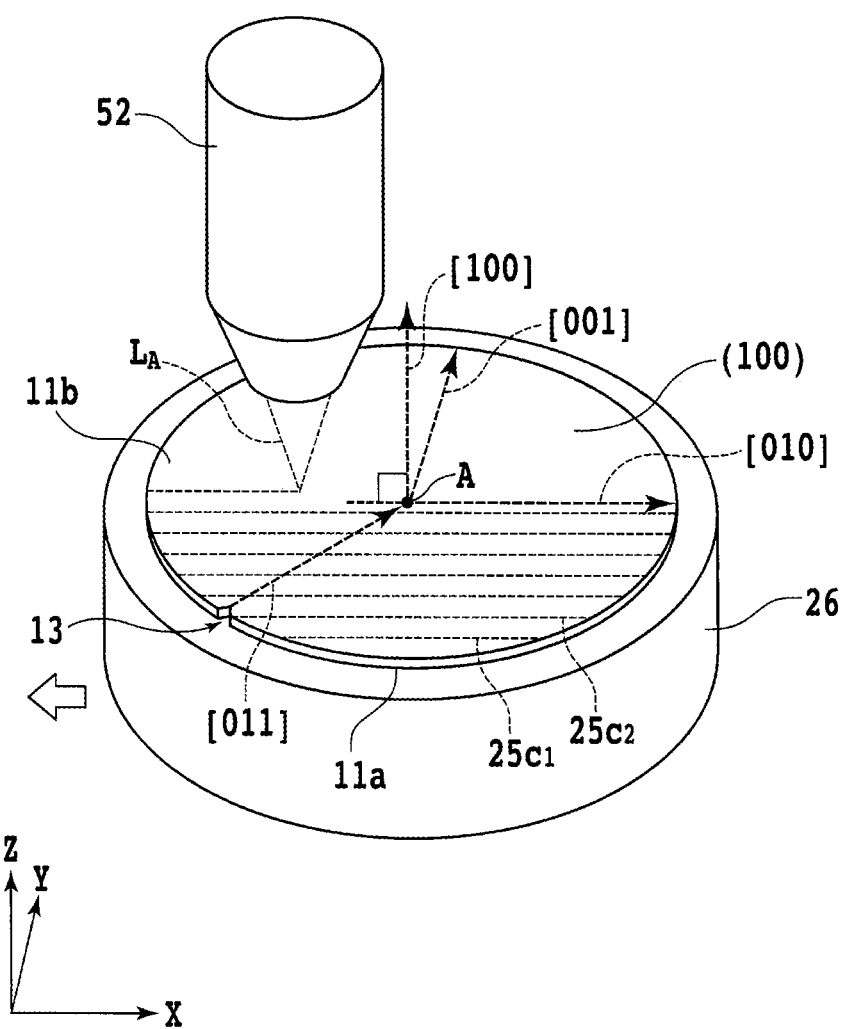
FIG. 8 is a perspective view illustrating a separation layer forming step.
Figure 9:
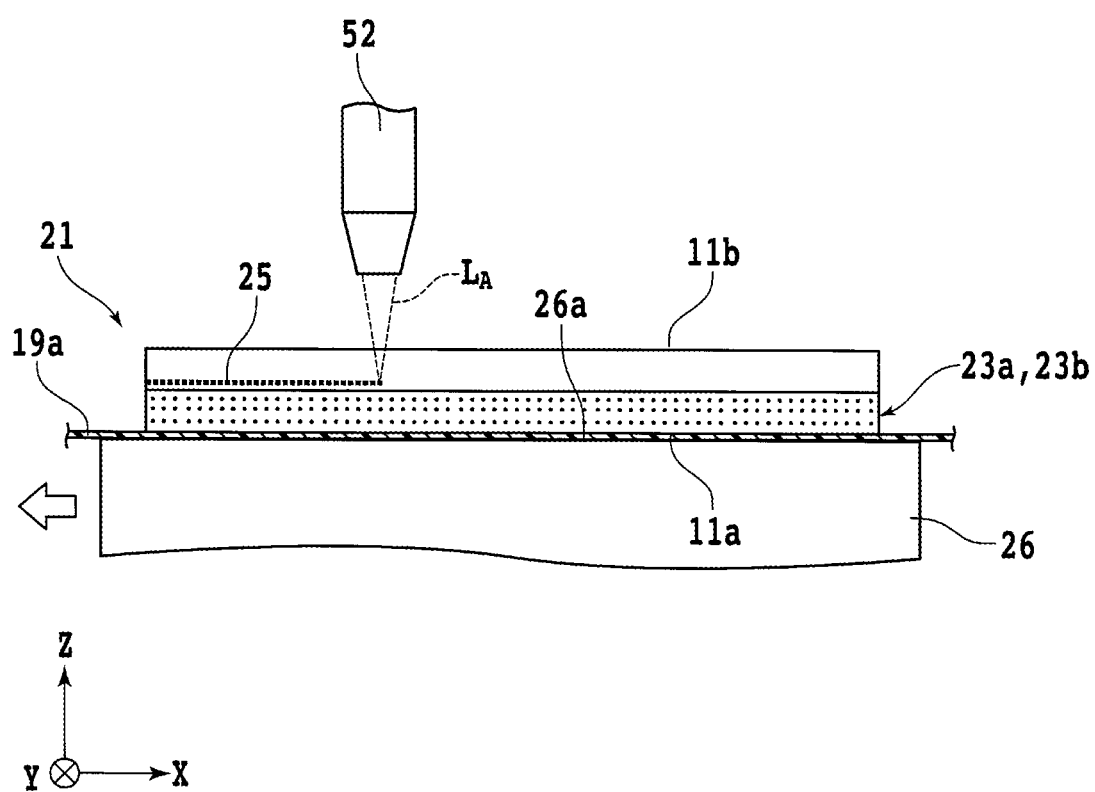
FIG. 9 is a partially sectional side view illustrating the separation layer forming step.

After the dividing origin forming step S20, by using the laser processing apparatus 2 continuously, the separation layer 25 along the crystal plane (100) of the front surface 11*a* and the back surface 11*b* is formed at a predetermined depth corresponding to a position on the side of the back surface 11*b* relative to the dividing origins 23 (separation layer forming step S30). FIG. 8 is a perspective view illustrating the separation layer forming step S30. FIG. 9 is a partially sectional side view illustrating the separation layer forming step S30. In FIG. 8, the protective tape 19*a* and the frame 19*b* are omitted for convenience. In FIG. 9, the frame 19*b* is omitted for convenience. Further, in FIG. 9, in the thickness direction of the wafer 11, the depth range in which the modified regions 23*a* and the cracks 23*b* are formed is given dots.

In the separation layer forming step S30, first, the direction that goes from the notch 13 to the center A of the back surface 11*b* (in the present embodiment, the crystal orientation [011]) is detected by using the imaging unit 56. Subsequently, as illustrated in FIG. 8, the chuck table 26 is rotated around the predetermined rotation axis to cause the acute angle formed by the direction that goes from the notch 13 to the center A of the back surface 11*b* (crystal orientation) [011]) and the X-axis direction to become 45°. Thereby, the orientation of the wafer 11 is adjusted in such a manner that the crystal orientation [010], which is parallel to the crystal plane (100) and is one of the crystal orientations <100> of the wafer 11, becomes parallel to the X-axis direction.

Then, the focal points $P_1$ to $P_5$ of the laser beam $L_A$ are positioned to the predetermined depth on the side of the back surface 11*b* relative to the dividing origins 23 inside the wafer 11. For example, the focal points $P_1$ to $P_5$ are set at a predetermined position in a range from the position of the half thickness of the wafer 11 to a position of a predetermined thickness when the back surface 11*b* is regarded as the start point (when the total thickness is 775 μm, predetermined position in a range of 387.5 μm to 600 μm when the back surface 11*b* is regarded as the start point). In the present embodiment, scattering of the laser beam $L_A$ by the dividing origins 23 can be prevented by positioning the focal points $P_1$ to $P_5$ on the side of the back surface 11*b* relative to the dividing origins 23 (modified regions 23*a*).

Thereafter, near one end part of the wafer 11 in the Y-axis direction, irradiation with the laser beam $L_A$ is executed along the crystal orientation [010] (first direction) by relatively moving the focal points $P_1$ to $P_5$ and the wafer 11 from one end to the other end of the outer circumferential part of the wafer 11 along the X-axis direction (see the line 25*c*$_1$ in FIG. 8). Laser processing conditions are set as follows, for example.

Figure 10:
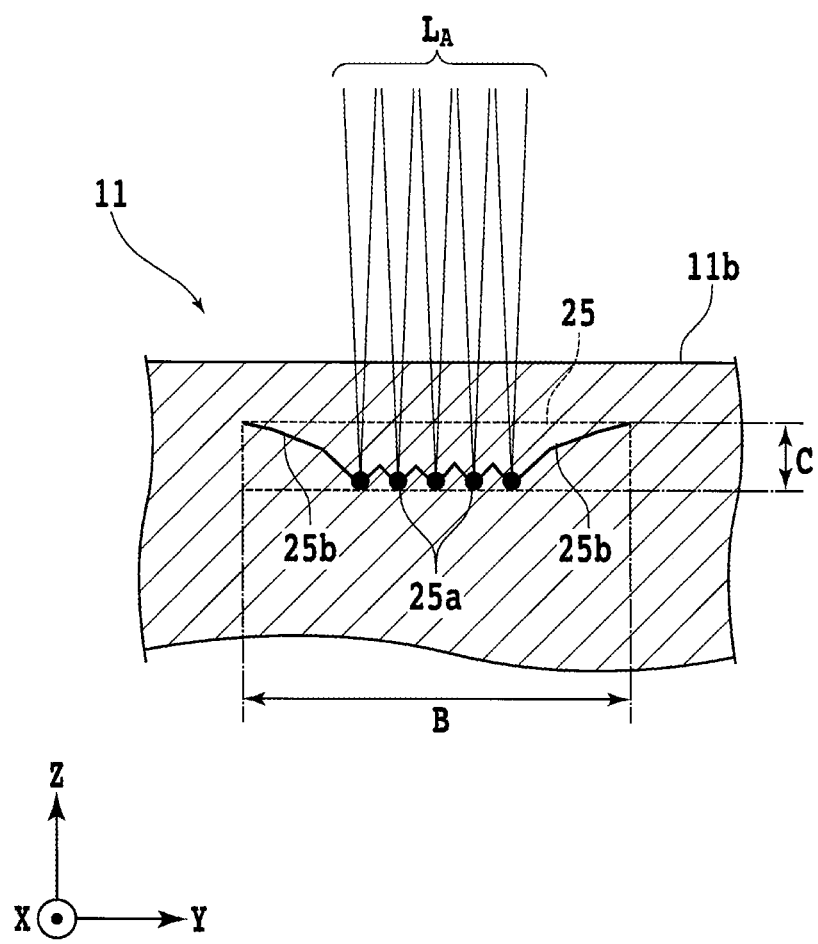
FIG. 10 is a diagram illustrating a modified region forming step in the separation layer forming step.

Wavelength of laser beam: 1342 nm
Average output power at one focal point: 0.5 W
Repetition frequency of pulse: 60 kHz
Processing feed rate: 360 mm/s
The number of passes: predetermined number of at least one and at most three Thereby, as illustrated in FIG. 10, modified regions 25*a* are formed along the movement direction of each of the focal points $P_1$ to $P_5$ (modified region forming step S32). That is, multiple modified regions 25*a* that line up along the Y-axis direction and extend along the X-axis direction are formed at substantially the same depth position in the Z-axis direction. FIG. 10 is a diagram illustrating the modified region forming step S32 in the separation layer forming step S30. In FIG. 10, width B and thickness C of the separation layer 25 formed in the modified region forming step S32 that is performed one time are illustrated. In the modified region forming step S32, cracks 25*b* extend along a predetermined crystal plane from each of the multiple modified regions 25*a*. As a result, the separation layer 25 including the multiple modified regions 25*a* and the cracks 25*b* that extend with each of the multiple modified regions 25*a* being the origin is formed inside the wafer 11.

Here, explanation will be made about formation of the cracks 25*b* in single-crystal silicon. In general, the single-crystal silicon is cleaved along the crystal plane {111} most easily and is cleaved along the crystal plane {110} second most easily. Thus, when the modified region 25*a* is formed along the crystal orientation <110> of the wafer 11, there occur many cracks 25*b* that extend along the crystal plane {111} from the modified region 25*a*. For example, if the modified region 25*a* is formed along the direction from the notch 13 toward the center A (crystal orientation [011]), there occur many cracks 25*b* that extend along the crystal plane {111} from the modified region 25*a*.

On the other hand, when multiple modified regions 25*a* are formed in a linear region along the crystal orientation <100> in such a manner as to line up along the direction orthogonal to the direction in which this linear region extends in plan view, there occur many cracks 25*b* that extend along a crystal plane parallel to the direction in which the linear modified regions 25*a* extend in crystal planes {N10} (N is a natural number equal to or smaller than 10 excluding 0) from each of the multiple modified regions 25*a*. For example, when multiple modified regions 25*a* are formed in a linear region along the crystal orientation [010] (X-axis direction) in such a manner as to line up along the direction (Y-axis direction) orthogonal to the direction in which this linear region extends in plan view as described above, there occur many cracks 25*b* that extend along a crystal plane parallel to the crystal orientation in crystal planes {N10} (N is a natural number equal to or smaller than 10 excluding 0) from each of the multiple modified regions 25*a*.

Specifically, when the multiple modified regions 25*a* are formed as above, the cracks 25*b* easily extend in crystal planes indicated by the following expression 1 and expression 2.

$$(101), (201), (301), (401), (501), \qquad \text{[Math. 1]}$$
$$(601), (701), (801), (901), (\underline{10}01)$$

$$(\overline{1}01), (\overline{2}01), (\overline{3}01), (\overline{4}01), (\overline{5}01), \qquad \text{[Math. 2]}$$
$$(\overline{6}01), (\overline{7}01), (\overline{8}01), (\overline{9}01), (\overline{\underline{10}}01)$$

Incidentally, the acute angle formed by the crystal plane (100) and the crystal plane parallel to the crystal orientation [010] in crystal planes {N10} is larger than 0° and is equal to or smaller than 45°. In contrast, the acute angle formed by the crystal plane (100) and the crystal plane {111} is approximately 54.7°. Thus, in a case in which irradiation with the laser beam $L_A$ is executed along the crystal orientation [010] (former case), the separation layer 25 tends to have a wide width and be thin compared with a case in which irradiation with the laser beam $L_A$ is executed along the crystal orientation [011] (latter case). Therefore, the value of the ratio of width B and thickness C (B/C) in the separation layer 25 (including the modified regions 25a and the cracks 25b) illustrated in FIG. 10 becomes larger in the former case than that in the latter case.

After the irradiation with the laser beam $L_A$ is executed from one end to the other end of the outer circumferential part of the wafer 11 along the crystal orientation [010] (first direction), indexing feed of the focal points $P_1$ to $P_5$ and the wafer 11 is executed relatively (indexing feed step S34). In the indexing feed step S34, indexing feed of the chuck table 26 is executed by a predetermined feed amount along the crystal orientation [001] (second direction, Y-axis direction), which is parallel to the crystal plane (100) and is orthogonal to the crystal orientation [010] (first direction, X-axis direction). The feed amount is set equal to or larger than the above-described width B of the separation layer 25, for example. When width B of the separation layer 25 is a predetermined length of at least 250 μm and at most 280 μm, the feed amount is set to a predetermined value of at least 520 μm and at most 530 μm, for example.

Figure 11:
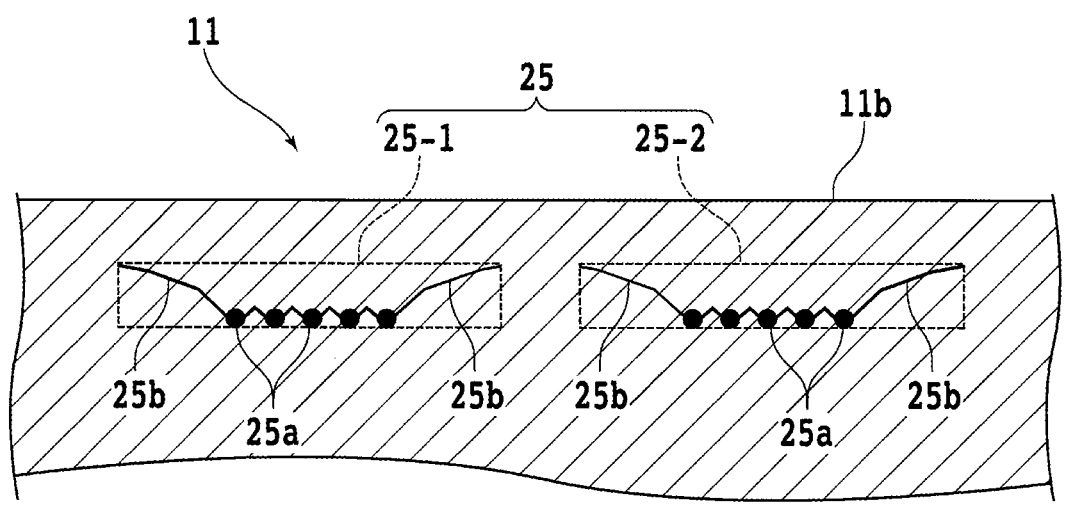
FIG. 11 is a sectional view of part of the wafer illustrating a separation layer formed in a first round and a second round of the modified region forming step.

Subsequently, the modified region forming step S32 is executed again (see the line $25c_2$ in FIG. 8). FIG. 11 is a sectional view of part of the wafer 11 illustrating the separation layer 25 formed in the first round and the second round of the modified region forming step S32. In the second round of the modified region forming step S32, the separation layer 25 (separation layer 25-2) is formed that is substantially parallel to the separation layer 25 (separation layer 25-1) formed in the first round of the modified region forming step S32, that is at substantially the same depth position as the separation layer 25-1, and that is separate from the separation layer 25-1 in the Y-axis direction. In this manner, the modified region forming step S32 and the indexing feed step S34 are repeated to form multiple separation layers 25-1, 25-2, and so forth each extending from one end to the other end in the X-axis direction from one end part to the other end part in the Y-axis direction. This forms the separation layer 25 across substantially the whole surface of the wafer 11 at the predetermined depth.

After the separation layer 25 is formed from one end part to the other end part in the Y-axis direction, the wafer 11 is separated into the front-surface-side wafer 31 including the multiple devices 17 and the back-surface-side wafer 33 that is located on the side of the back surface 11b and does not include the devices 17 by using the separation layer 25 as the origin (separation step S40). In the separation step S40, a separating apparatus 60 is used (see FIG. 12). The separating apparatus 60 has a chuck table 62 with a circular plate shape. An annular groove (not illustrated) with a predetermined depth is formed in the upper surface of the chuck table 62, and an opening is formed in the bottom surface of this groove.

The opening located in the bottom surface of the groove communicates with a suction source (not illustrated) such as a vacuum pump through a predetermined flow path. Thus, when the suction source is operated, a negative pressure is transmitted to the upper surface of the chuck table 62 through the opening and the groove. Therefore, the upper surface of the chuck table 62 functions as a holding surface 62a that sucks and holds the wafer 11 with the interposition of the protective tape 19a. A rotational drive source (not illustrated) such as a motor for rotating the chuck table 62 around a rotation axis 62b that passes through the center of the holding surface 62a and is substantially parallel to the vertical direction is disposed at a lower part of the chuck table 62.

Figure 14A:
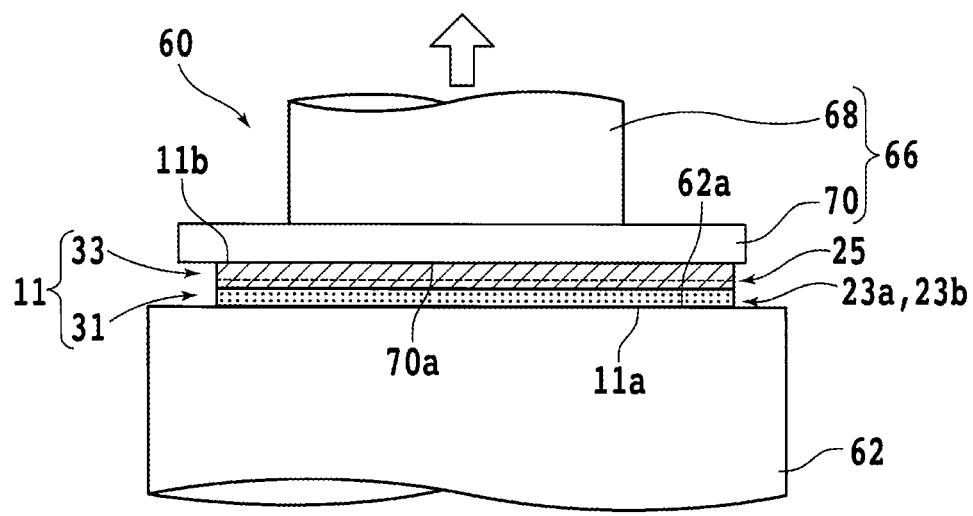
FIG. 14A is a partially sectional side view illustrating the separation step.

A wedge part 64 is disposed near the chuck table 62. The wedge part 64 has one end part 64a that is comparatively sharp. The one end part 64a is disposed to be oriented inward in the radial direction of the holding surface 62a. A sharp pointed body such as a needle or pin may be used instead of the wedge part 64. Further, as illustrated in FIG. 14A, a suction unit 66 is disposed over the holding surface 62a. The suction unit 66 has a casing 68 with a circular column shape. For example, a raising-lowering mechanism (not illustrated) of a ball screw system is coupled to an upper part of the casing 68. The suction unit 66 is raised and lowered by operating this raising-lowering mechanism.

A circular plate-shaped suction part 70 with a larger diameter than the wafer 11 is fixed to a lower end part of the casing 68. Multiple suction ports (not illustrated) each having a circular shape are formed in the lower surface of the suction part 70. Each suction port communicates with a suction source (not illustrated) such as a vacuum pump through a flow path formed inside the suction part 70. A negative pressure is transmitted to the suction ports when the suction source is operated. This causes the lower surface of the suction part 70 to function as a holding surface 70a that sucks and holds the wafer 11.

Next, the separation step S40 will be described with reference to FIG. 12 to FIG. 14B. First, the wafer unit 21 is placed on the holding surface 62a with the back surface 11b exposed upward. Subsequently, the side of the front surface 11a is sucked and held by the holding surface 62a with the interposition of the protective tape 19a. Then, the one end part 64a of the wedge part 64 is positioned to a height position corresponding to the separation layer 25. However, it suffices that the height position of the one end part 64a is near the separation layer 25, and the height position does not necessarily need to be completely the same height position as the separation layer 25. The orientation of the wedge part 64 is adjusted to cause application of an external force substantially perpendicular to the side surface of the wafer 11.

Figure 12:
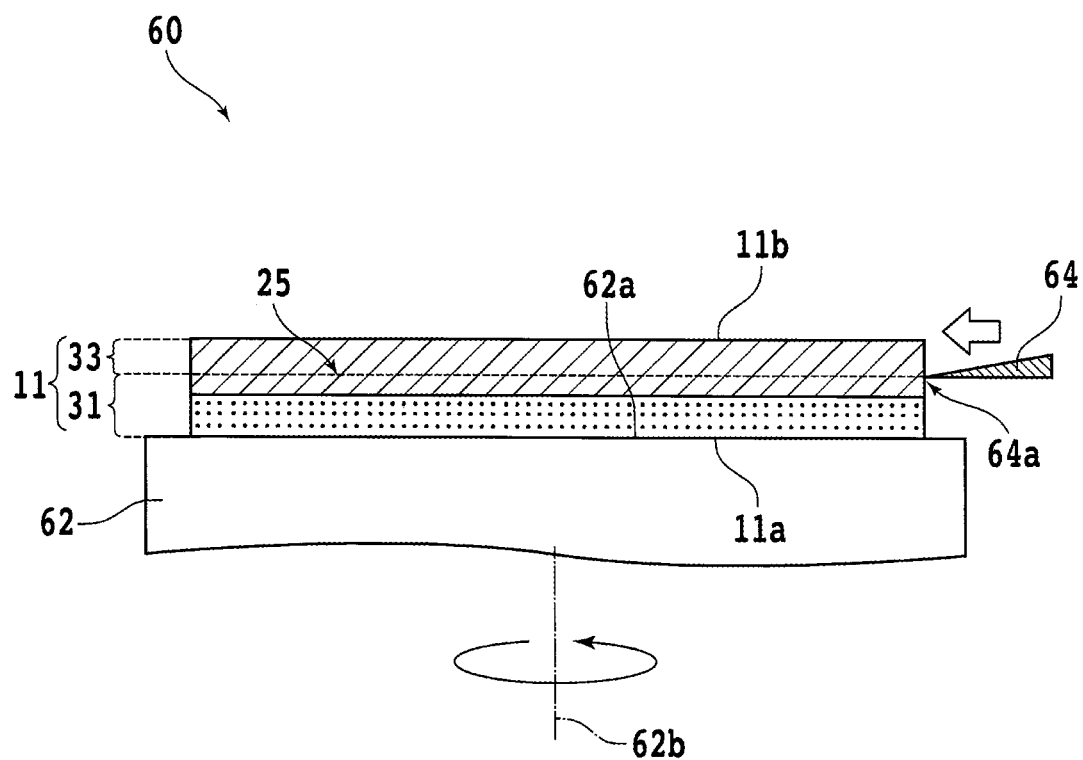
FIG. 12 is a diagram illustrating the state in which an external force is given to the wafer in a separation step.
Figure 13:
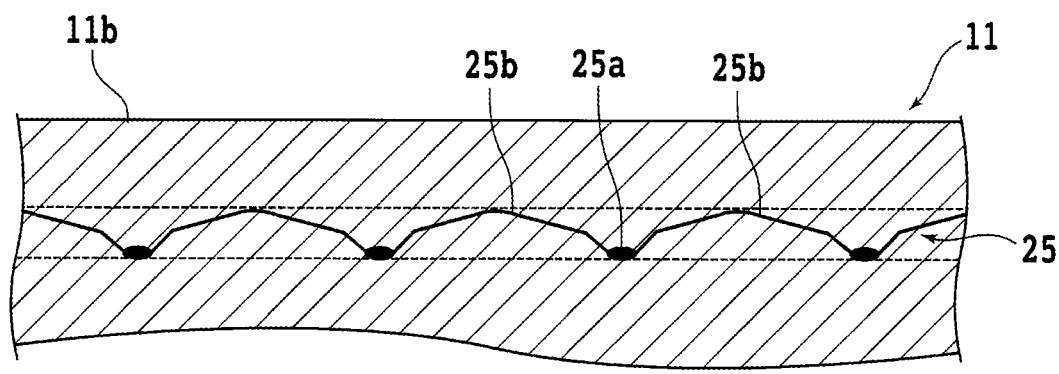
FIG. 13 is a sectional view of part of the wafer illustrating the separation layer in the state in which cracks connect to each other.

Thereafter, while the chuck table 62 and the wedge part 64 are relatively rotated along the circumferential direction of the chuck table 62, the worker pushes the one end part 64a of the wedge part 64 into the outer circumferential side surface of the wafer 11 to give an external force to the wafer 11. FIG. 12 is a diagram illustrating the state in which the external force is given to the wafer 11 in the separation step S40. In FIG. 12, the protective tape 19a and the frame 19b are omitted for convenience. Due to the giving of the external force, the cracks 25b of the separation layer 25 extend, and the cracks 25b connect to each other (see FIG. 13). FIG. 13 is a sectional view of part of the wafer 11 illustrating the separation layer 25 in a state in which the cracks 25b connect to each other.

Figure 14B:
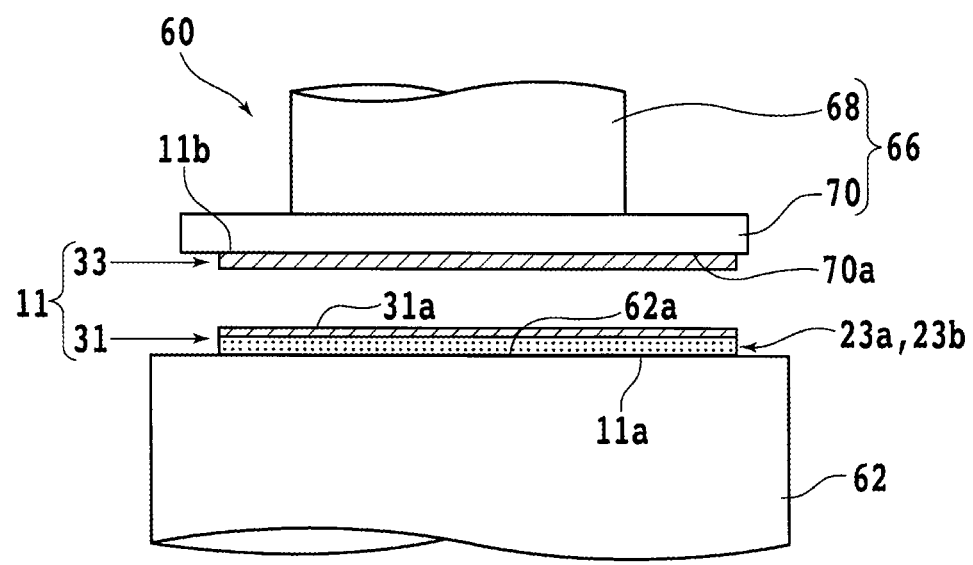
FIG. 14B is a partially sectional side view illustrating a front-surface-side wafer and a back-surface-side wafer after the separation step.

Subsequently, the suction unit 66 is lowered, and the holding surface 70a is brought into contact with the back surface 11b. Then, the side of the back surface 11b is sucked and held by the holding surface 70a, and thereafter, the suction unit 66 is raised (see FIG. 14A). The wafer 11 separates into the front-surface-side wafer 31 and the back-surface-side wafer 33 with the separation layer 25 being the origin (separation step S40) (see FIG. 14B). FIG. 14A is a partially sectional side view illustrating the separation step S40. FIG. 14B is a partially sectional side view illustrating the front-surface-side wafer 31 and the back-surface-side wafer 33 after the separation step S40. In FIG. 14A and FIG. 14B, the protective tape 19a and the frame 19b are omitted for convenience.

Incidentally, in the separation step S40, the cracks 25b may be connected to each other along the front surface 11a or the back surface 11b by giving ultrasonic vibrations to the wafer 11 instead of giving an external force to the wafer 11 by using the wedge part 64 or the like. For example, for the wafer 11 in which the side of the front surface 11a is sucked and held, a circular plate-shaped vibrating component (not illustrated) having an ultrasonic transducer is brought close to the side of the back surface 11b. Then, a liquid such as purified water is supplied from a nozzle (not illustrated) to the side of the back surface 11b at a predetermined flow rate and ultrasonic vibrations are given from the vibrating component to the wafer 11 through the liquid.

After the separation step S40, the side of the separation surface (third surface) 31a located on the opposite side to the front surface 11a in the front-surface-side wafer 31 is ground (grinding step S50). In the grinding step S50, a grinding apparatus 72 is used (see FIG. 15). The grinding apparatus 72 has a chuck table 74 with a circular plate shape. The chuck table 74 has a circular plate-shaped frame body formed of a non-porous ceramic. A recessed part (not illustrated) with a circular plate shape is formed at a central part of the frame body. A circular plate-shaped porous plate formed of a ceramic is fixed to this recessed part.

A predetermined flow path (not illustrated) is formed in the frame body. A negative pressure is transmitted from a suction source (not illustrated) such as an ejector to the upper surface of the porous plate through the predetermined flow path. The upper surface of the porous plate has a circular cone shape in which the central part slightly protrudes compared with the outer circumferential part. The circular upper surface of the porous plate and the annular upper surface of the frame body are substantially flush with each other and function as a substantially flat holding surface for sucking and holding the wafer 11. A table base (not illustrated) that rotatably supports the chuck table 74 and has a circular annular flat plate shape is disposed at a lower part of the chuck table 74. Further, an inclination adjustment mechanism (not illustrated) that adjusts the inclination of the chuck table 74 is disposed at a lower part of the table base.

Figure 15:
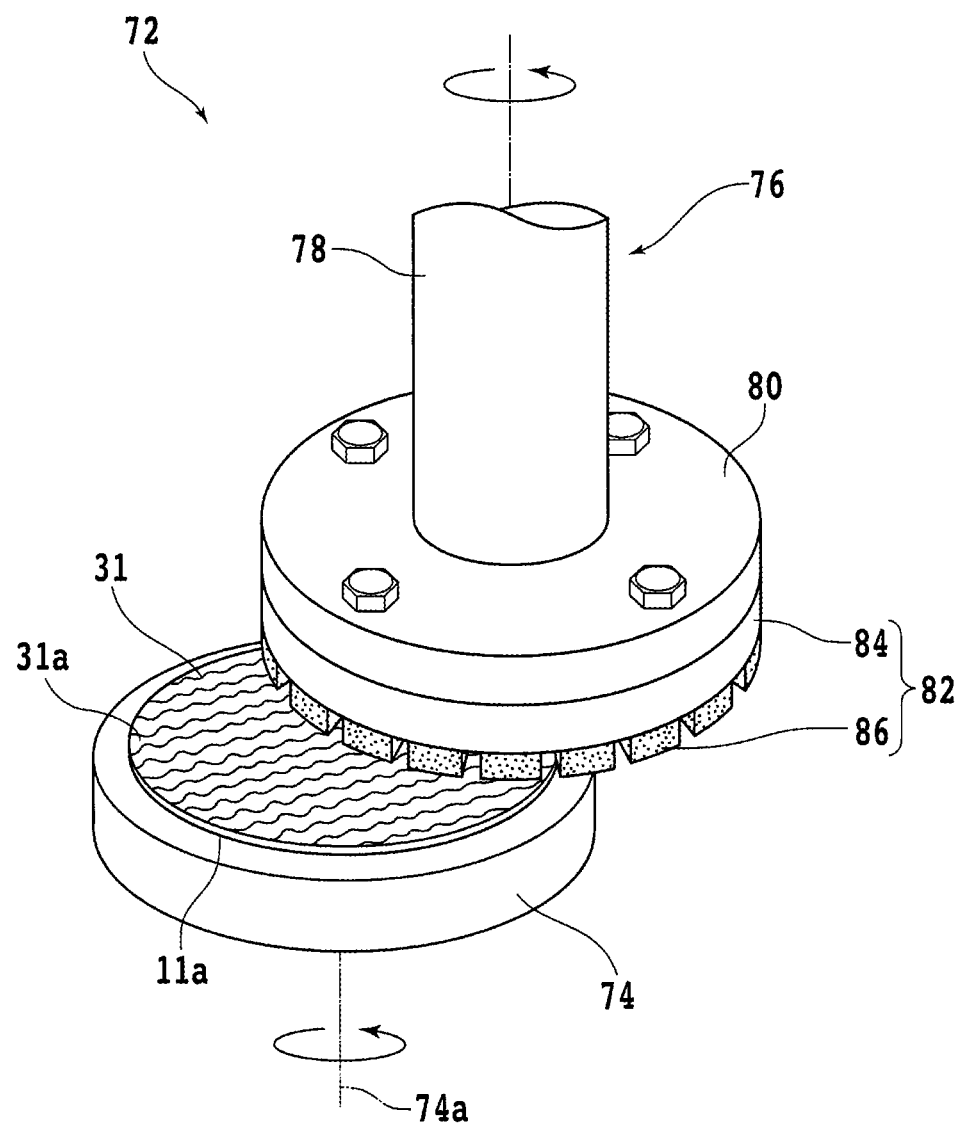
FIG. 15 is a diagram illustrating a grinding step.

Moreover, a rotating shaft 74a (in FIG. 15, illustrated by a one-dot chain line) is coupled to the lower part of the chuck table 74. A rotational drive source (not illustrated) such as a motor is coupled to the rotating shaft 74a through a pulley, a belt, and so forth. The chuck table 74 rotates around the rotating shaft 74a when the rotational drive source is operated.

A grinding unit 76 is disposed over the chuck table 74. The grinding unit 76 has a circular cylindrical spindle housing (not illustrated) having a longitudinal part disposed in substantially parallel to the vertical direction. A processing feed mechanism (not illustrated) of a ball screw system that moves the grinding unit 76 along a predetermined direction (for example, vertical direction) is coupled to the spindle housing. Further, part of a spindle 78 with a circular column shape is rotatably housed in the spindle housing. A rotational drive source such as a motor is disposed near an upper end part of the spindle 78. A mount 80 with a circular plate shape is fixed to a lower end part of the spindle 78. A circular annular grinding wheel 82 is mounted on the lower surface side of the mount 80.

The grinding wheel 82 has a base 84 formed of an aluminum alloy. The upper surface side of the base 84 is disposed to be in contact with the mount 80. On the lower surface side of the base 84, multiple grinding abrasive stones 86 are disposed at substantially equal intervals along the circumferential direction of the base 84. Each grinding abrasive stone 86 has a bond of a metal, ceramic, resin, or the like and abrasive grains of diamond, cubic boron nitride (cBN), or the like, for example. Abrasive grains whose average grain size is comparatively large are used for rough grinding abrasive stones and abrasive grains whose average grain size is comparatively small are used for finish grinding abrasive stones. When the spindle 78 is rotated, a circular annular grinding surface is formed by the locus of the lower surfaces of the multiple grinding abrasive stones 86. The grinding surface is a plane orthogonal to the longitudinal direction of the spindle 78.

FIG. 15 is a diagram illustrating the grinding step S50. In FIG. 15, the protective tape 19a and the frame 19b are omitted for convenience. In the grinding step S50, first, the side of the front surface 11a of the front-surface-side wafer 31 is sucked and held by the holding surface of the chuck table 74 with the interposition of the protective tape 19a. Subsequently, the table base is inclined to cause part of the holding surface of the chuck table 74 to become substantially parallel to the grinding surface of the grinding wheel 82. In this state, the chuck table 74 is rotated around the rotating shaft 74a at a predetermined rotation speed (for example, 200 rpm) and the grinding wheel 82 is rotated at a predetermined rotation speed (for example, 3000 rpm).

Figure 16:
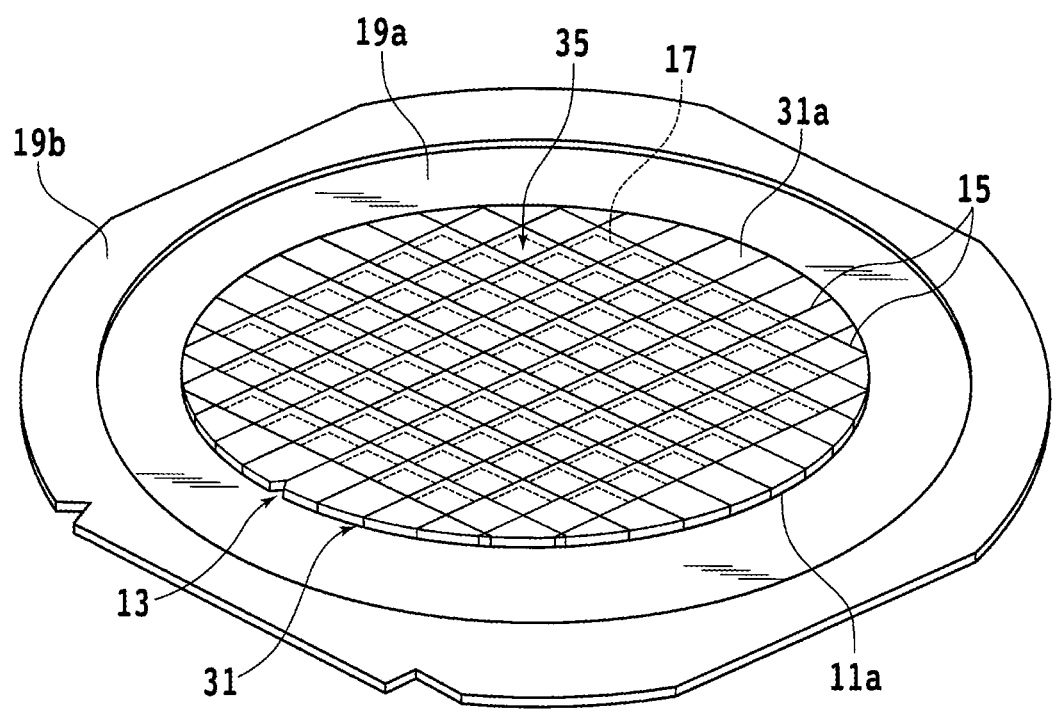
FIG. 16 is a perspective view illustrating multiple device chips.

Moreover, while a grinding liquid such as purified water is supplied from a grinding liquid supply nozzle (not illustrated) to the contact region between the grinding surface and the separation surface 31a, the grinding unit 76 is moved downward (that is, processing feed) at a predetermined processing feed rate (for example, 1.0 μm/s). The grinding surface gets contact with the side of the separation surface 31a, and thereby the side of the separation surface 31a is ground. The side of the separation surface 31a is ground and planarized until the grinding surface reaches the above-described dividing origins 23. In addition, the front-surface-side wafer 31 is divided into the multiple device chips 35 (see FIG. 16). FIG. 16 is a perspective view illustrating the multiple device chips 35.

In the grinding step S50 of the present embodiment, rough grinding of the side of the separation surface 31a is executed by one grinding unit 76 having rough grinding abrasive stones as the grinding abrasive stones 86 (that is, a rough grinding unit), and thereafter finish grinding of the side of the separation surface 31a is executed by another grinding unit 76 having finish grinding abrasive stones as the grinding abrasive stones 86 (that is, a finish grinding unit). Grinding the side of the separation layer 25 (that is, the side of the separation surface 31a) of the front-surface-side wafer 31 can divide the front-surface-side wafer 31 into the multiple device chips 35.

Moreover, after the finish grinding, the side of the separation surface 31a may be polished by using a polishing unit (not illustrated). The polishing unit has the spindle 78 and a polishing pad mounted on the lower end part of the spindle 78. By executing the polishing in addition to the rough grinding and the finish grinding, the flexural strength of the device chips 35 can be improved compared with a case in which the polishing is not executed.

In the present embodiment, the separation layer 25 is formed on the side of the front surface 11a relative to the back surface 11b and the side of the separation surface 31a of the front-surface-side wafer 31 is ground after the separation step S40. Therefore, the amount of grinding of the wafer 11 can be reduced compared with the case of grinding the wafer 11 from the back surface 11b. In addition, the back-surface-side wafer 33 can be reused as a new single-crystal silicon wafer.

Incidentally, if the dividing origin forming step S20 is executed after the separation layer forming step S30, the dividing origins 23 are formed on the side of the front surface 11a after the separation layer 25 is formed on the side of the back surface 11b. In this case, in order to avoid scattering of the laser beam $L_A$ due to the separation layer 25 on the side of the back surface 11b, first, the side of the front surface 11a is sucked and held by the holding surface 26a, and the separation layer 25 is formed on the side of the back surface 11b, in the separation layer forming step S30. Then, in the subsequent dividing origin forming step S20, the dividing origins 23 need to be formed on the side of the front surface 11a relative to the separation layer 25 with the side of the back surface 11b sucked and held by the holding surface 26a. For this purpose, the protective tape 19a needs to be removed from the side of the back surface 11b, and the wafer 11 needs to be inverted, after the separation layer forming step S30 and before the dividing origin forming step S20.

In contrast, in the present embodiment, the separation layer forming step S30 is executed after the dividing origin forming step S20. Therefore, there is an advantage that the processing can be advanced to the grinding step S50 with use of the protective tape 19a without any change therein.

Incidentally, in the above-described processing method, by irradiating a linear region along the crystal orientation [010] with the split laser beam $L_A$, the multiple modified regions 25a are formed to line up along the direction orthogonal to the direction in which this linear region extends in plan view. In this case, there occur many cracks 25b that extend along a crystal plane parallel to the crystal orientation [010] of single-crystal silicon in crystal planes {N10} (N is a natural number equal to or smaller than 10 excluding 0) from each of the multiple modified regions 25a. Due to this, in the above-described processing method, the separation layer 25 can be allowed to have a wide width and be thin compared with a case in which irradiation with the laser beam $L_A$ is executed along the crystal orientation [011] of the wafer 11. As a result, in manufacturing of the device chips 35 from the wafer 11, shortening of the time necessary for laser processing and reduction in the amount of single-crystal silicon removed due to grinding or the like are obtained.

The above-described processing method of the wafer 11 is one aspect of the present invention, and the present invention is not limited to the above-described method. For example, the wafer 11 is not limited to that illustrated in FIG. 1, FIG. 2, and so forth. Specifically, in the present invention, a single-crystal silicon wafer in which an orientation flat is formed at an outer circumferential part may be processed. A single-crystal silicon wafer in which neither the notch 13 nor an orientation flat is formed at an outer circumferential part may be processed.

Further, the structure of the laser processing apparatus used in the present invention is not limited to the structure of the above-described laser processing apparatus 2. For example, the present invention may be carried out by using a laser processing apparatus equipped with a horizontal movement mechanism that moves the irradiation head 52 and so forth of the laser beam irradiation unit 42 along the X-axis direction and/or the Y-axis direction. That is, in the present invention, it suffices that the chuck table 26 that holds the wafer 11 and the irradiation head 52 that emits the laser beam $L_A$ can relatively move along each of the X-axis direction and the Y-axis direction, and there is no restriction on the structure for this purpose.

Moreover, in the present invention, the linear region inside the wafer 11 irradiated with the laser beam $L_A$ in the separation layer forming step S30 is not limited to the linear region along the crystal orientation [010]. For example, in the present invention, a linear region along the along the crystal orientation [001] may be irradiated with the laser beam $L_A$. In this case, the cracks 25b easily extend in crystal planes indicated by the following expression 3 and expression 4.

$$(110), (210), (310), (410), (510),$$ [Math. 3]
$$(610), (710), (810), (910), (\underline{10}10)$$

$$(\overline{1}10), (\overline{2}10), (\overline{3}10), (\overline{4}10), (\overline{5}10), (\overline{6}10), (\overline{7}10), (\overline{8}10), (\overline{9}10), (\overline{\underline{10}}10)$$ [Math. 4]

Figure 17:
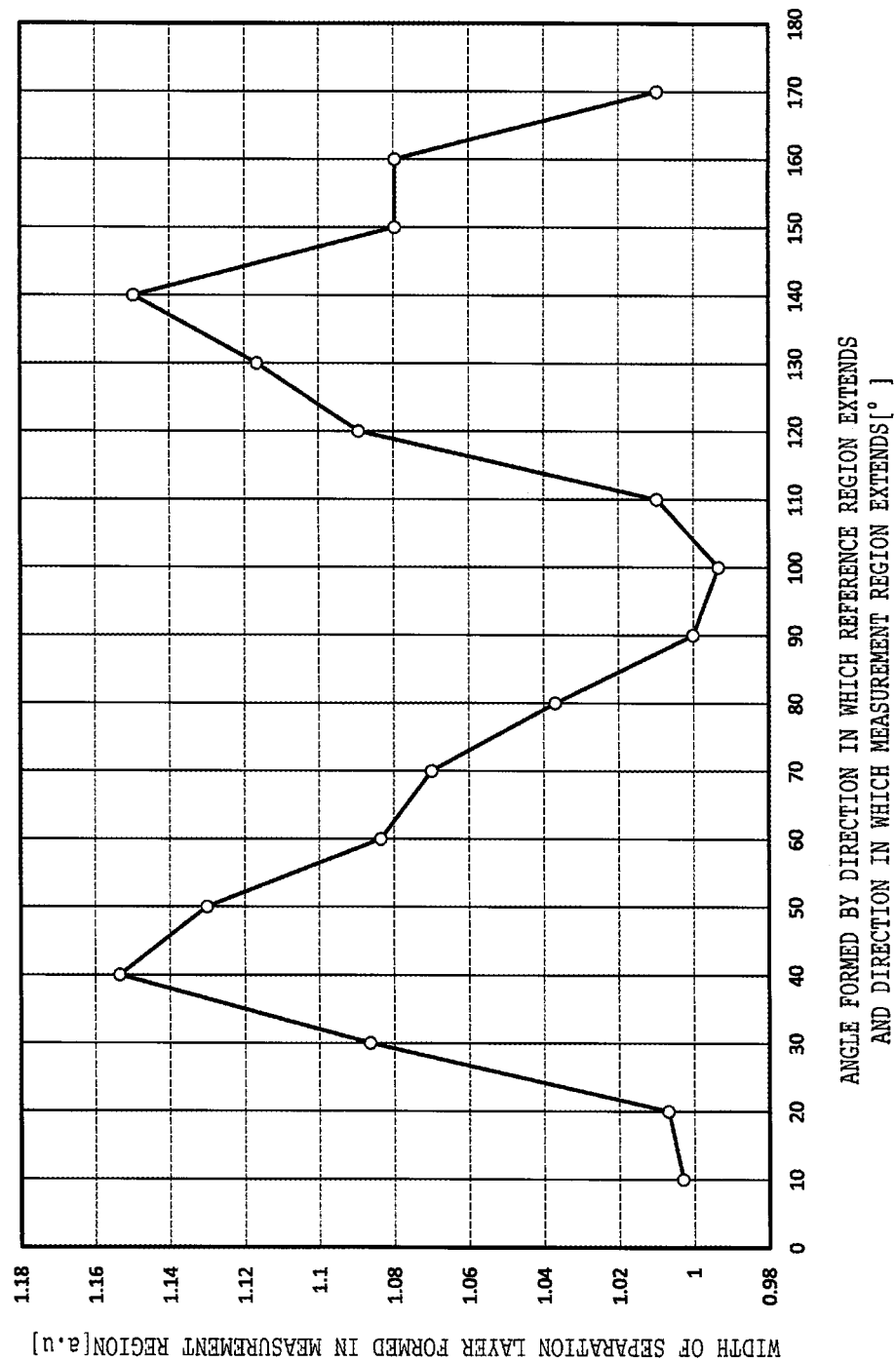
FIG. 17 is a graph illustrating the width of the separation layer formed inside the wafer when linear regions that are each along a different crystal orientation are irradiated with a laser beam.

Moreover, in the present invention, a linear region along a direction slightly inclined from the crystal orientation [010] or the crystal orientation [001] in plan view may be irradiated with the laser beam $L_A$. Regarding this point, description will be made with reference to FIG. 17. FIG. 17 is a graph illustrating width B (see FIG. 10) of the separation layer 25 formed inside the wafer 11 when linear regions that are each along a different crystal orientation are irradiated with the laser beam $L_A$.

The abscissa axis of the graph indicates the angle formed by the direction in which a linear region orthogonal to the crystal orientation [011] (reference region) extends and the direction in which a linear region that becomes a measurement subject (measurement region) extends in plan view of the wafer 11. That is, when the linear region along the crystal orientation [001] is the measurement subject, the value of the abscissa axis of this graph is 45° (see 45° in FIG. 2). Similarly, when the linear region along the crystal orientation [010] is the measurement subject, the value of the abscissa axis of this graph is 135° (see 135° in FIG. 2).

The ordinate axis of the graph illustrated in FIG. 17 indicates the value obtained when width B of the separation layer 25 formed in the measurement region by irradiating the measurement region with the laser beam $L_A$ is divided by width B of the separation layer 25 formed in the reference region by irradiating the reference region with the laser beam $L_A$. As illustrated in FIG. 17, width B of the separation layer 25 in the measurement region becomes comparatively wide when the angle formed by the direction in which the reference region extends and the direction in which the measurement region extends is at least 40° and at most 50° or at least 130° and at most 140°. That is, width B of the separation layer 25 becomes comparatively wide not only when the linear region along the crystal orientation [001] or the crystal orientation [010] is irradiated with the laser beam $L_A$ but also when the linear region along a direction in which the acute angle formed between the direction and either of these crystal orientations is equal to or smaller than 5° is irradiated with the laser beam $L_A$. Thus, in the present invention, the linear region along a direction that is parallel to the crystal plane (100) and is inclined from the crystal orientation [001] or the crystal orientation [010] by at most 5° may be irradiated with the laser beam $L_A$.

Incidentally, in the separation layer forming step S30, after the separation layer 25 is formed from one end part to the other end part of the inside of the wafer 11 in the Y-axis direction through repeating the modified region forming step S32 and the indexing feed step S34, the separation layer 25 may be formed from one end part to the other end part in the Y-axis direction at substantially the same depth position inside the wafer 11 again. Through executing multiple times of the separation layer forming step S30 in this manner, the density of each of the modified regions 25a and the cracks 25b included in the separation layer 25 increases compared with the case of executing the separation layer forming step S30 one time. Therefore, the separation between the front-surface-side wafer 31 and the back-surface-side wafer 33 becomes easy in the separation step S40.

Further, in a case of executing multiple times of the separation layer forming step S30, the cracks 25b included in the separation layer 25 further extend, and width B (see FIG. 10) of the separation layer 25 becomes wide compared with the case of executing the separation layer forming step S30 one time. Therefore, in the case of executing multiple times of the separation layer forming step S30, the relative movement distance (index) of the irradiation head 52 and the chuck table 26 in the Y-axis direction in the indexing feed step S34 can be set long compared with the case of executing the separation layer forming step S30 one time.

Furthermore, in the separation layer forming step S30, after the modified region forming step S32 and before the indexing feed step S34, the modified region forming step S32 may be executed again. That is, the linear region in which the separation layer 25 has been already formed may be irradiated with the laser beam $L_A$ to form the separation layer 25 again. Also in this case, the separation between the front-surface-side wafer 31 and the back-surface-side wafer 33 in the separation step S40 becomes easy, and the index in the indexing feed step S34 can be set longer.

Figure 18:
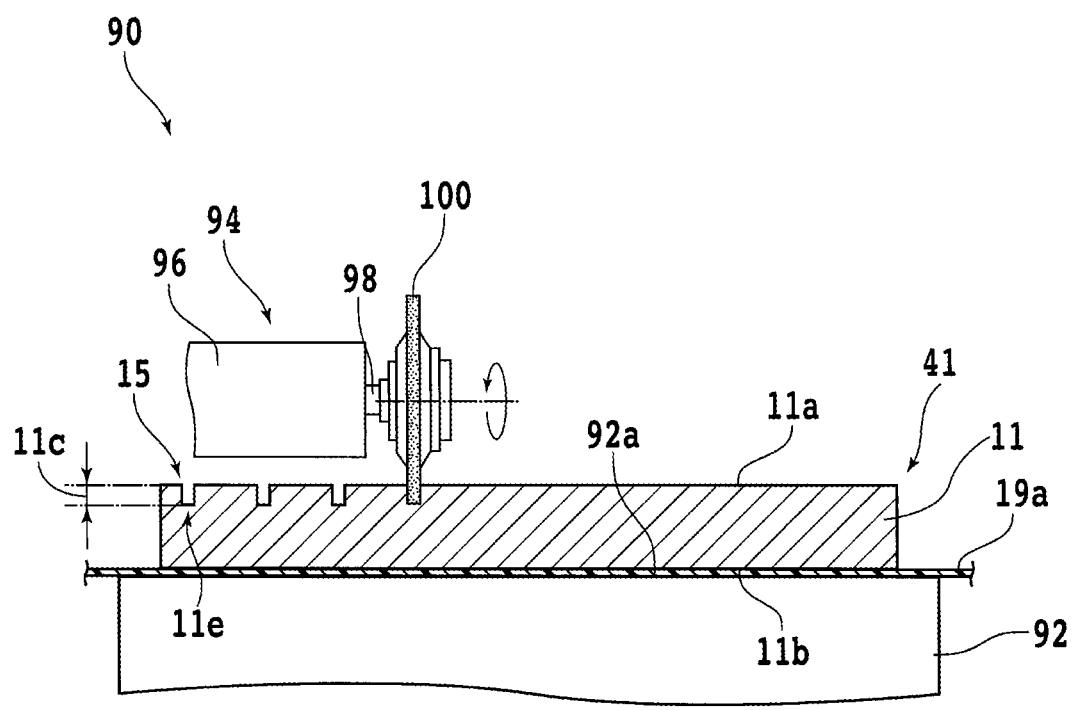
FIG. 18 is a partially sectional side view illustrating the state in which cutting processing of the front surface side is executed.

Next, second and third embodiments in which the dividing origin forming step S20 is executed by cutting processing will be described. For the cutting processing, a cutting apparatus 90 illustrated in FIG. 18 is used. The cutting apparatus 90 has a chuck table 92 with a circular plate shape. The chuck table 92 has a holding surface 92a that sucks and holds the wafer 11. The shape, structure, functions, and so forth of the chuck table 92 are the same as the chuck table 26 illustrated in FIG. 4, and thus, detailed description thereof is omitted.

A rotational drive source (not illustrated) such as a motor is coupled to a bottom part of the chuck table 92. The chuck table 92 and the rotational drive source can move along the X-axis direction by an X-axis movement mechanism (not illustrated) of a ball screw system in a state in which they are supported by an X-axis moving plate (not illustrated). A cutting unit 94 is disposed over the chuck table 92. The cutting unit 94 has a cylindrical spindle housing 96 having a longitudinal part disposed along the Y-axis direction. The spindle housing 96 can move along the Y-axis and Z-axis directions by a Y-axis movement mechanism and a Z-axis movement mechanism (neither is illustrated) each based on a ball screw system. Further, an imaging unit (not illustrated) similar to the imaging unit 56 in FIG. 4 is disposed at a side part of the spindle housing 96. Part of a spindle 98 with a circular column shape is rotatably housed in the spindle housing 96.

A longitudinal part of the spindle 98 is disposed along the Y-axis direction. A rotational drive source (not illustrated) such as a motor is disposed near one end part of the spindle 98. The other end part of the spindle 98 protrudes from the spindle housing 96, and a cutting blade 100 is mounted on a tip part that protrudes. For example, the dividing origin forming step S20 by the cutting processing is executed after the holding step S10 and before the separation layer forming step S30 (second embodiment). In a case of executing the cutting processing, first, a wafer unit 41 in which the side of the back surface 11b is supported by the frame 19b (not illustrated in FIG. 18) through the protective tape 19a is formed. Then, the side of the back surface 11b is sucked and held by the holding surface 92a with the interposition of the protective tape 19a with the side of the front surface 11a exposed upward.

Subsequently, the orientation of the chuck table 92 is adjusted to cause one planned dividing line 15 to become substantially parallel to the X-axis direction. Then, outside the holding surface 92a, the cutting blade 100 is rotated at a predetermined rotation speed, and a bottom part of the cutting blade 100 is disposed at a depth position corresponding to the finished thickness 11c from the front surface 11a. By executing processing feed of the chuck table 92 along the X-axis direction at a predetermined processing feed rate in this state, a cut groove 11e having a depth corresponding to the finished thickness 11c from the front surface 11a is formed along the one planned dividing line 15. The cut groove 11e functions as the dividing origin 23.

FIG. 18 is a partially sectional side view illustrating the state in which the cutting processing of the side of the front surface 11a is executed. The cut groove 11e is referred to also as a half-cut groove but does not necessarily have the depth that is just half the thickness of the wafer 11. The cut groove 11e of the present embodiment is a groove that has a depth that does not reach the back surface 11b and is shallow compared with the thickness of the wafer 11. In the cutting, cutting water (not illustrated) such as purified water is supplied to the vicinity of the processing point at a predetermined flow rate. Processing conditions in the cutting are set as follows, for example.

Spindle rotation speed: 30,000 rpm
Processing feed rate: predetermined value of at least 1.0 mm/s and at most 20 mm/s
Flow rate of cutting water: predetermined value of at least 0.5 L/min and at most 1.5 L/min.

After the cut groove 11e is formed along the one planned dividing line 15, indexing feed of the cutting unit 94 is executed, and the cut groove 11e is similarly formed along another planned dividing line 15 adjacent to the planned dividing line 15 along which the cut groove 11e has been formed. In this manner, the cut grooves 11e are formed along all planned dividing lines 15 along the one direction. Thereafter, the chuck table 92 is rotated by 90°. Then, the cut grooves 11e are similarly formed along all planned dividing lines 15 along the other direction orthogonal to the one direction. After the dividing origin forming step S20, the wafer unit 21 in which the protective tape 19a is stuck to the side of the front surface 11a is formed.

Figure 19A:
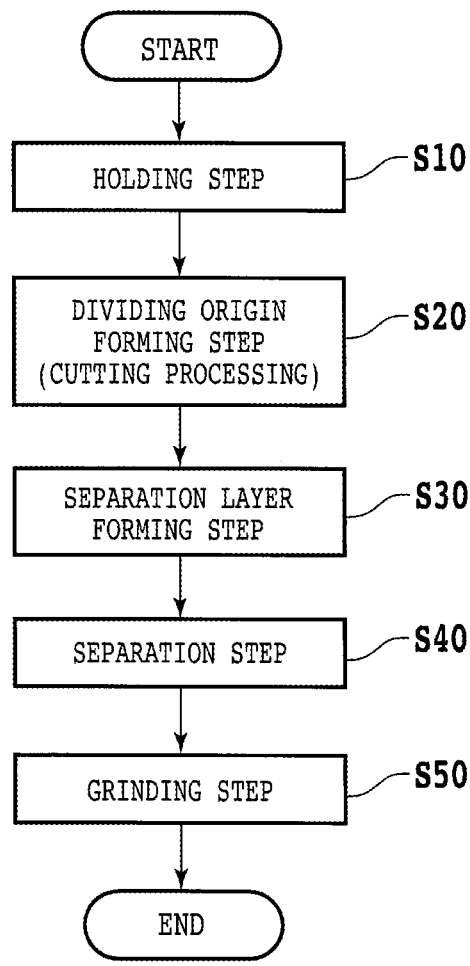
FIG. 19A is a flowchart of a processing method according to a second embodiment.

Then, in the separation layer forming step S30, the focal point of the laser beam $L_A$ is positioned to the side of the back surface 11b relative to the bottom parts of the cut grooves 11e, and the separation layer 25 is formed. In the separation layer forming step S30, the wafer unit 21 in which the protective tape 19a is stuck to the side of the front surface 11a is formed. Then, the focal point of the laser beam $L_A$ is positioned to the side of the back surface 11b relative to the bottom parts of the cut grooves 11e, and the separation layer 25 is formed. After the separation layer forming step S30, the separation step S40 and the grinding step S50 are sequentially executed. FIG. 19A is a flowchart of the processing method according to the second embodiment.

Figure 19B:
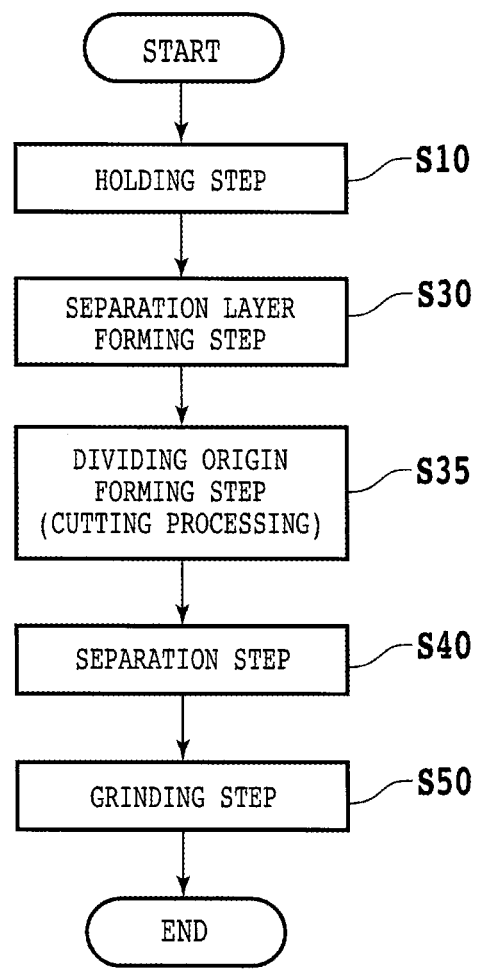
FIG. 19B is a flowchart of a processing method according to a third embodiment.

In contrast, in the third embodiment, a dividing origin forming step S35 by cutting processing is executed after the holding step S10 and the separation layer forming step S30. FIG. 19B is a flowchart of the processing method according to the third embodiment. In the dividing origin forming step S35 of the third embodiment, the cut grooves 11e are formed in such a manner that the bottom parts of the cut grooves 11e are located on the side of the front surface 11a relative to the separation layer 25. That is, the separation layer 25 is formed at a depth position on the side of the back surface 11b relative to the dividing origins 23.

Also in the processing methods according to the second and third embodiments, the front-surface-side wafer 31 can be divided into multiple device chips 35 when the side of the separation layer 25 in the front-surface-side wafer 31 is ground in the grinding step S50 after the separation step S40. Therefore, the amount of grinding of the wafer 11 can be reduced compared with the case of grinding the wafer 11 from the back surface 11b of the wafer 11.

Figure 20:
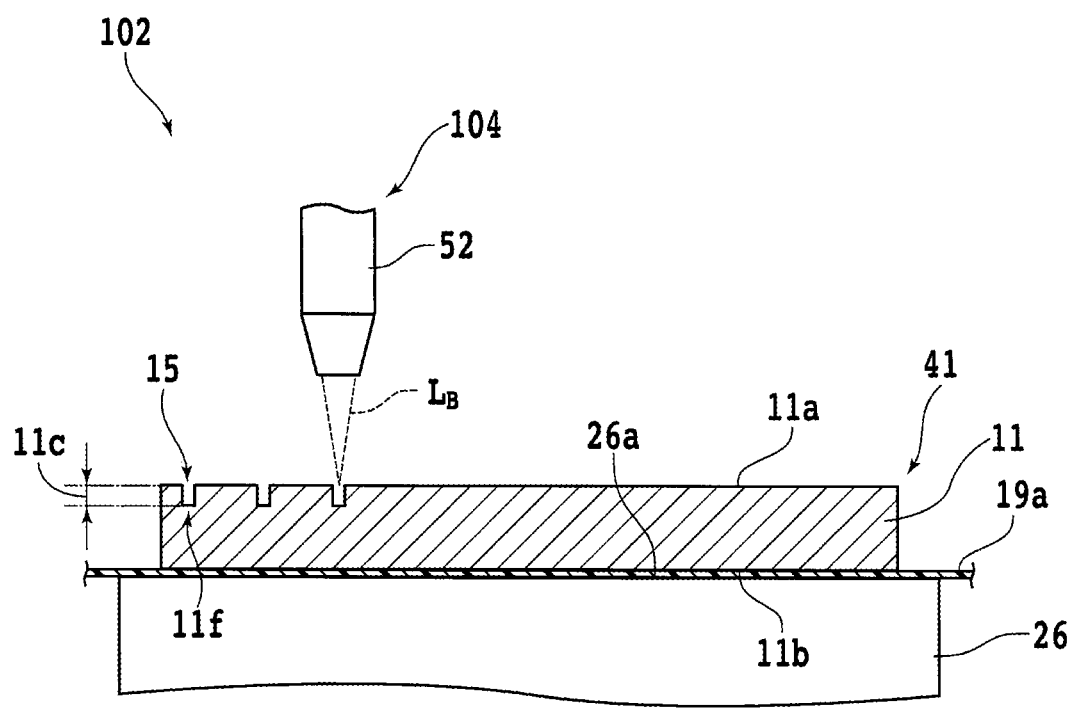
FIG. 20 is a partially sectional side view illustrating the state in which ablation processing is executed for the front surface side.

Next, fourth and fifth embodiments in which the dividing origin forming step S20 is executed by ablation processing will be described. For the ablation processing, a laser processing apparatus 102 illustrated in FIG. 20 is used. Compared with the laser processing apparatus 2 illustrated in FIG. 4, the laser processing apparatus 102 has a laser beam irradiation unit 104 different from the laser beam irradiation unit 42 but is substantially the same as the laser processing apparatus 2 except for the laser beam irradiation unit 104. The laser beam irradiation unit 104 has the laser oscillator 44 fixed to the base 4.

The laser oscillator 44 has a rod-shaped laser medium formed of Nd:YAG or Nd:YVO$_4$. A pulsed laser beam emitted from the laser oscillator 44 passes through a wavelength converting part (not illustrated), the attenuator 46, and so forth and is output from the irradiation head 52 toward the holding surface 26a. The wavelength converting part has a nonlinear optical crystal that generates harmonics of the laser beam, for example. The wavelength converting part converts the fundamental wavelength emitted from the laser oscillator 44 to a pulsed laser beam $L_B$ having such a wavelength as to be absorbed by the wafer 11. For example, the wavelength converting part converts a fundamental wavelength 1064 nm to the third harmonic (for example, 355 nm). Processing conditions in the ablation processing are set as follows, for example.

Wavelength of laser beam: 355 nm
Average output power: predetermined value of at least 0.3 W and at most 4.0 W
Repetition frequency of pulse: predetermined value of at least 10 kHz and at most 200 kHz
Processing feed rate: predetermined value of at least 1.0 mm/s and at most 1000 mm/s
The number of passes: predetermined number of at least one and at most 10

The laser beam irradiation unit 104 does not have the splitting unit 48. The laser beam $L_B$ is not split, and the number of focal points is one. For example, the dividing origin forming step S20 by the ablation processing is executed after the holding step S10 and before the separation layer forming step S30 (fourth embodiment). In a case of executing the ablation processing, first, the wafer unit 41 in which the side of the back surface 11b is supported by the frame 19b (not illustrated in FIG. 20) through the protective tape 19a is formed. Then, a water-soluble resin film (not illustrated) with a substantially uniform thickness is formed on the side of the front surface 11a.

Subsequently, the side of the back surface 11b is sucked and held by the holding surface 26a with the interposition of the protective tape 19a with the side of the front surface 11a exposed upward. Next, the orientation of the chuck table 26 is adjusted to cause one planned dividing line 15 to become substantially parallel to the X-axis direction. Then, the focal point of the laser beam $L_B$ is positioned to substantially the same height as the front surface 11a, and processing feed of the chuck table 26 is executed along the X-axis direction at a predetermined processing feed rate. Thereby, a processed groove 11f having a depth corresponding to the finished thickness 11c from the front surface 11a is formed along the one planned dividing line 15. The processed groove 11f functions as the dividing origin 23.

FIG. 20 is a partially sectional side view illustrating the state in which the ablation processing is executed for the side of the front surface 11a. After the processed groove 11f is formed along the one planned dividing line 15, indexing feed of the chuck table 26 is executed and the processed groove 11f is similarly formed along another planned dividing line 15 adjacent to the planned dividing line 15 along which the processed groove 11f has been formed. In this manner, the processed grooves 11f are formed along all planned dividing lines 15 along the one direction.

Thereafter, the chuck table 92 is rotated by 90°. Then, the processed grooves 11f are similarly formed along all planned dividing lines 15 along the other direction orthogonal to the one direction. Subsequently, by removing the water-soluble resin film on the side of the front surface 11a by spin cleaning, processing dust (debris) that has adhered to the water-soluble resin film in the ablation processing is removed. Thereafter, through drying the side of the front surface 11a, the dividing origin forming step S20 is ended.

Figure 21A:
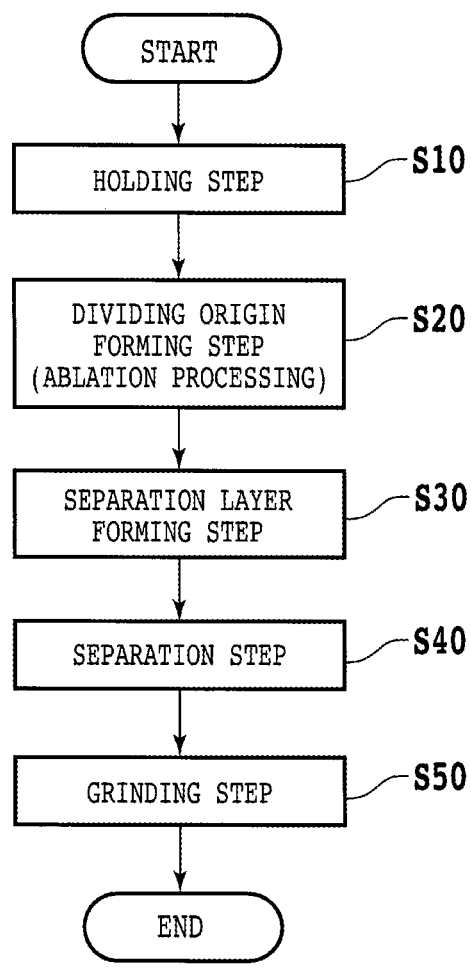
FIG. 21A is a flowchart of a processing method according to a fourth embodiment.

After the dividing origin forming step S20, the wafer unit 21 in which the protective tape 19a is stuck to the side of the front surface 11a is formed. Then, in the separation layer forming step S30, the focal point of the laser beam $L_A$ is positioned to the side of the back surface 11b relative to the bottom parts of the processed grooves 11f, and the separation layer 25 is formed. Thereafter, the separation step S40 and the grinding step S50 are sequentially executed. FIG. 21A is a flowchart of the processing method according to the fourth embodiment. In contrast, in the fifth embodiment, the dividing origin forming step S35 by ablation processing is executed after the holding step S10 and the separation layer forming step S30.

Figure 21B:
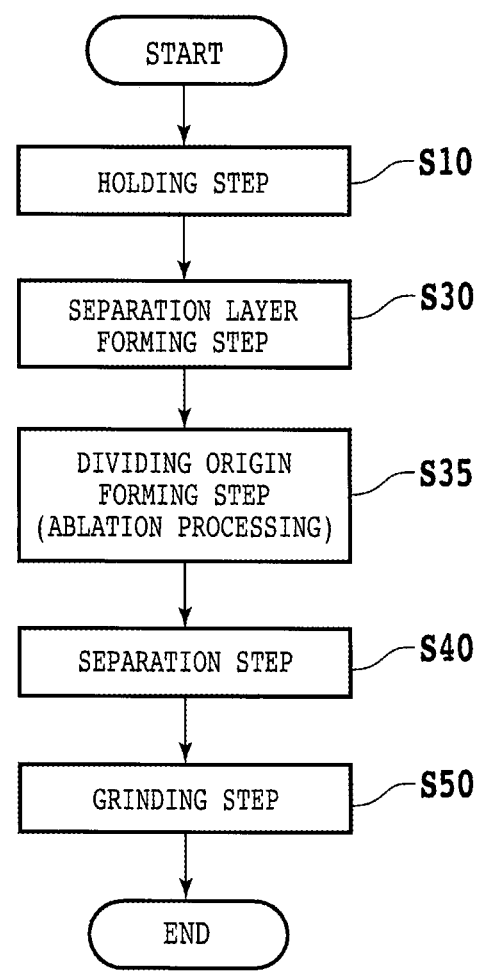
FIG. 21B is a flowchart of a processing method according to a fifth embodiment.

In the dividing origin forming step S35 of the fifth embodiment, the processed grooves 11f are formed in such a manner that the bottom parts of the processed grooves 11f are located on the side of the front surface 11a relative to the separation layer 25. That is, the separation layer 25 is formed at a depth position on the side of the back surface 11b relative to the dividing origins 23. FIG. 21B is a flowchart of the processing method according to the fifth embodiment. Also in the processing methods according to the fourth and fifth embodiments, the front-surface-side wafer 31 can be divided into multiple device chips 35 when the side of the separation layer 25 in the front-surface-side wafer 31 is ground in the grinding step S50 after the separation step S40. Therefore, the amount of grinding of the wafer 11 can be reduced compared with the case of grinding the wafer 11 from the back surface 11b of the wafer 11.

Besides, structures, methods, and so forth according to the above-described embodiments can be carried out with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for processing a single-crystal silicon wafer that has a first surface and a second surface located on an opposite side to the first surface that are formed in such a manner that a specific crystal plane included in a crystal plane {100} is exposed in each of the first surface and the second surface and has devices each formed in corresponding one of multiple regions marked out by multiple planned dividing lines set in a lattice manner in the first surface, the processing method comprising:

a dividing origin forming step of forming dividing origins for dividing the single-crystal silicon wafer along each planned dividing line at least at a depth corresponding to a finished thickness of device chips;

a separation layer forming step of forming a separation layer along the crystal plane of the second surface at a depth corresponding to a position on a side of the second surface relative to the dividing origins through positioning a focal point of a pulsed laser beam having such a wavelength as to be transmitted through the single-crystal silicon wafer to an inside of the single-crystal silicon wafer and relatively moving the focal point and the single-crystal silicon wafer along a first direction that is parallel to the crystal plane of the second surface and in which an acute angle formed between the first direction and a crystal orientation <100> is equal to or smaller than 5°; and a separation step of separating the single-crystal silicon wafer into a first-surface-side wafer including multiple devices formed on a side of the first surface and a second-surface-side wafer that is located on the side of the second surface and does not include the devices by using the separation layer as an origin after the dividing origin forming step and the separation layer forming step, wherein the separation layer forming step has a modified region forming step of forming modified regions by relatively moving the focal point of the laser beam and the single-crystal silicon wafer along the first direction, and an indexing feed step of executing indexing feed of the focal point and the single-crystal silicon wafer relatively in a second direction that is parallel to the crystal plane of the second surface and is orthogonal to the first direction, and the separation layer includes the modified regions and cracks that extend with the modified regions being origins.

2. The processing method according to claim 1, further comprising:

a grinding step of grinding a side of a third surface located on an opposite side to the first surface in the first-surface-side wafer and dividing the first-surface-side wafer into multiple device chips after the separation step.